(12) United States Patent
Pai et al.

(10) Patent No.: US 10,991,944 B2
(45) Date of Patent: Apr. 27, 2021

(54) SYNTHESIS OF GAMMA MONOCLINIC SULFUR AND SULFUR BATTERIES CONTAINING MONOCLINIC SULFUR

(71) Applicant: DREXEL UNIVERSITY, Philadelphia, PA (US)

(72) Inventors: Rahul Nagesh Pai, Philadelphia, PA (US); Vibha Kalra, Garnet Valley, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 16/900,389

(22) Filed: Jun. 12, 2020

(65) Prior Publication Data

US 2020/0321600 A1 Oct. 8, 2020

Related U.S. Application Data

(63) Continuation of application No. PCT/US2020/013490, filed on Jan. 14, 2020.

(60) Provisional application No. 62/792,068, filed on Jan. 14, 2019.

(51) Int. Cl.
| | |
|---|---|
| *H01M 4/04* | (2006.01) |
| *H01M 4/58* | (2010.01) |
| *H01M 2/16* | (2006.01) |
| *H01M 4/38* | (2006.01) |
| *H01M 4/40* | (2006.01) |
| *H01M 4/46* | (2006.01) |
| *H01M 4/64* | (2006.01) |
| *H01M 10/39* | (2006.01) |
| *H01M 4/133* | (2010.01) |
| *H01M 4/1393* | (2010.01) |
| *H01M 10/0525* | (2010.01) |
| *H01M 4/02* | (2006.01) |

(52) U.S. Cl.
CPC ....... *H01M 4/5815* (2013.01); *H01M 2/1633* (2013.01); *H01M 2/1673* (2013.01); *H01M 4/0423* (2013.01); *H01M 4/133* (2013.01); *H01M 4/1393* (2013.01); *H01M 4/382* (2013.01); *H01M 4/405* (2013.01); *H01M 4/463* (2013.01); *H01M 4/466* (2013.01); *H01M 4/64* (2013.01); *H01M 10/0525* (2013.01); *H01M 10/3918* (2013.01); *H01M 2004/028* (2013.01); *H01M 2300/0051* (2013.01)

(58) Field of Classification Search
CPC ............................ H01M 4/0423; H01M 4/133
See application file for complete search history.

(56) References Cited

U.S. PATENT DOCUMENTS

| | | | |
|---|---|---|---|
| 4,226,208 A | 10/1980 | Nishida et al. | |
| 5,466,494 A * | 11/1995 | Matsuno ............. | C23C 14/0021 427/126.1 |
| 8,900,484 B2 | 12/2014 | Barchasz et al. | |
| 9,666,899 B2 | 5/2017 | He et al. | |
| 9,755,236 B2 | 9/2017 | Zhamu et al. | |
| 9,755,241 B2 | 9/2017 | Zhamu et al. | |
| 9,780,349 B2 | 10/2017 | Zhamu et al. | |
| 9,780,379 B2 | 10/2017 | Zhamu et al. | |
| 9,905,856 B1 | 2/2018 | Zhamu et al. | |
| 10,003,078 B2 | 6/2018 | Zhamu et al. | |
| 10,084,182 B2 | 9/2018 | Pan et al. | |
| 10,158,121 B2 | 12/2018 | Zhamu et al. | |
| 10,170,749 B2 | 1/2019 | Zhamu et al. | |
| 10,199,637 B2 | 2/2019 | Zhamu et al. | |
| 10,454,141 B2 | 10/2019 | Zhamu et al. | |
| 10,461,321 B2 | 10/2019 | He et al. | |
| 2015/0303454 A1* | 10/2015 | Otter ...................... | H01M 4/36 252/182.1 |
| 2016/0240840 A1 | 8/2016 | He et al. | |
| 2016/0240841 A1 | 8/2016 | He et al. | |
| 2016/0294000 A1 | 10/2016 | He et al. | |
| 2016/0301075 A1 | 10/2016 | Zhamu et al. | |
| 2016/0301078 A1 | 10/2016 | Zhamu et al. | |
| 2016/0344010 A1 | 11/2016 | Zhamu et al. | |
| 2016/0344035 A1 | 11/2016 | Zhamu et al. | |
| 2017/0207484 A1 | 7/2017 | Zhamu et al. | |
| 2017/0207488 A1 | 7/2017 | Zhamu et al. | |
| 2017/0352868 A1 | 12/2017 | Zhamu et al. | |
| 2017/0352869 A1 | 12/2017 | Zhamu et al. | |
| 2017/0373297 A1 | 12/2017 | Zhamu et al. | |
| 2017/0373322 A1 | 12/2017 | Zhamu et al. | |

(Continued)

FOREIGN PATENT DOCUMENTS

| | | |
|---|---|---|
| CN | 108878816 A | 11/2018 |
| KR | 10-2016-0029475 A | 3/2016 |
| WO | WO2011010010 A1 | 1/2011 |

OTHER PUBLICATIONS

Jung et al. "Monoclinic sulfur cathode utilizing carbon for high-performance lithium-sulfur batteries" (2016).*
Greenwood et al. Chemistry of the Elements. (1997) pp. 652-656.*
Manthiram, Arumugam et al., "Rechargeable lithium-sulfur batteries." Chemical reviews 114.23 (2014): 11751-11787.
Armand, Michel et al., "Building better batteries." Nature 451.7179 (2008): 652-657.

(Continued)

*Primary Examiner* — Austin Murata
(74) *Attorney, Agent, or Firm* — Mendelsohn Dunleavy, P.C.

(57) ABSTRACT

The present invention relates to a method for making a novel cathode employing a monoclinic sulfur phase that enables a single plateau lithium-sulfur reaction in, for example, a carbonate electrolyte system. The cathode is applicable to a variety of other types of anodes. The method produces a cathode suitable for use in an electrode of a cell or battery by depositing monoclinic phase sulfur via vapor deposition onto a substrate in a sealed vapor deposition apparatus.

20 Claims, 25 Drawing Sheets

(56) References Cited

U.S. PATENT DOCUMENTS

| | | |
|---|---|---|
| 2018/0083266 A1 | 3/2018 | Zhamu et al. |
| 2018/0083289 A1 | 3/2018 | Zhamu et al. |
| 2018/0183024 A1 | 6/2018 | Zhamu et al. |
| 2018/0183052 A1 | 6/2018 | Zhamu et al. |
| 2018/0183067 A1 | 6/2018 | Zhamu et al. |
| 2018/0212252 A1* | 7/2018 | Dillard ............... H01M 4/38 |
| 2018/0233784 A1 | 8/2018 | Zhamu et al. |
| 2018/0241031 A1 | 8/2018 | Pan et al. |
| 2018/0294475 A1 | 10/2018 | Zhamu et al. |
| 2018/0351196 A1 | 12/2018 | Zhamu et al. |
| 2018/0351198 A1 | 12/2018 | Zhamu et al. |
| 2019/0006719 A1 | 1/2019 | Zhamu et al. |
| 2019/0006721 A1 | 1/2019 | Zhamu et al. |
| 2019/0044138 A1 | 2/2019 | Zhamu et al. |
| 2019/0051902 A1 | 2/2019 | Zhamu et al. |
| 2019/0386295 A1 | 12/2019 | Zhamu et al. |
| 2019/0386296 A1 | 12/2019 | He et al. |
| 2019/0386332 A1 | 12/2019 | Zhamu et al. |
| 2019/0386337 A1 | 12/2019 | Zhamu et al. |
| 2019/0386342 A1 | 12/2019 | He et al. |
| 2019/0386347 A1 | 12/2019 | Zhamu et al. |

OTHER PUBLICATIONS

Evers, Scott et al., "New Approaches for High Energy Density Lithium-Sulfur Battery Cathodes." Accounts of Chemical Research 46.5 (2013): 1135-1143.

Bruce, Peter G., et al. "Li—O 2 and Li—S batteries with high energy storage." Nature materials 11.1 (2012): 19-29.

Fang, Ruopian, et al. "More Reliable Lithium-Sulfur Batteries: Status, Solutions and Prospects." Advanced Materials 29.48 (2017): 1606823, 25 pages.

Peng, Hong-Jie, et al. "Lithium-Sulfur Batteries: Review on High-Loading and High-Energy Lithium-Sulfur Batteries (Adv. Energy Mater. 24/2017)." Advanced Energy Materials 7.24 (2017): 1770141.

Lv, Dongping, et al. "High Energy Density Lithium-Sulfur Batteries: Challenges of Thick Sulfur Cathodes." Advanced Energy Materials 5.16 (2015): 1402290, 8 pages.

Liu, Min, et al. "A Review: Electrospun Nanofiber Materials for Lithium-Sulfur Batteries." Advanced Functional Materials 29.49 (2019): 1905467.

Yuan, Hong, et al. "A Review of Functional Binders in Lithium-Sulfur Batteries." Advanced Energy Materials 8.31 (2018): 1802107, 20 pages.

Aurbach, Doron, et al. "On the Surface Chemical Aspects of Very High Energy Density, Rechargeable Li-Sulfur Batteries" Journal of the Electrochemical Society 156.8 (2009): A694-A702.

Li, Xia, et al. "Safe and Durable High-Temperature Lithium-Sulfur Batteries via Molecular Layer Deposited Coating" Nano Letters 16.6 (2016): 3545-3549.

Xu, Zhixin, et al. "Enhanced Performance of a Lithium-Sulfur Battery Using a Carbonate-Based Electrolyte" Angewandte Chemie International Edition 55.35 (2016): 10372-10375.

Cleaver, Tom, et al. "P Perspective—Commercializing Lithium Sulfur Batteries: Are We Doing the Right Research?" Journal of the Electrochemical Society 165.1 (2018): A6029-A6033.

Choi, Jang Wook et al. "Promise and reality of post-lithium-ion batteries with high energy densities." Nature Reviews Materials 1.4 (2016): 1-16.

Marom, Rotem, et al. "A review of advanced and practical lithium battery materials." Journal of Materials Chemistry 21.27 (2011): 9938-9954.

Zhang, Sheng Shui. "A review on electrolyte additives for lithium-ion batteries." Journal of Power Sources 162.2 (2006): 1379-1394.

Yim, Taeeun, et al. "Effect of chemical reactivity of polysulfide toward carbonate-based electrolyte on the electrochemical performance of Li—S batteries." Electrochimica Acta 107 (2013): 454-460.

Helen, M., et al. "Single step transformation of sulphur to Li2S2/Li2S in Li—S batteries." Scientific Reports 5 (2015): 12146, 12 pages.

Xin, Sen, et al. "Smaller Sulfur Molecules Promise Better Lithium-Sulfur Batteries." Journal of the American Chemical Society 134.45 (2012): 18510-18513.

Fu, Chengyin, et al. "Solid state lithiation-delithiation of sulphur in sub-nano confinement: a new concept for designing lithium-sulphur batteries." Chemical Science 7.2 (2016): 1224-1232.

Chung, Sheng-Heng, et al. "Carbonized eggshell membrane as a natural polysulfide reservoir for highly reversible li-S batteries." Advanced Materials 26.9 (2014): 1360-1365.

Meyer, Beat. "Solid Allotropes of Sulfur." Chemical Reviews 64.4 (1964): 429-451.

Meyer, Beat. "Elemental Sulfur." Chemical Reviews 76.3 (1976): 367-388.

Takeda, Nobuhiro et al. "Polysulfido Complexes of Main Group and Transition Metals." Elemental Sulfur and Sulfur-Rich Compounds II. Topics in Current Chemistry, vol. 231.Springer, Berlin, Heidelberg, (2003):153-202.

Moon, San, et al. "Encapsulated monoclinic sulfur for stable cycling of Li—S rechargeable batteries." Advanced Materials 25.45 (2013): 6547-6553.

Gallacher, A. C. et al. "A redetermination of monclinic γ-sulfur." Acta Crystallographica Section C: Crystal Structure Communications 49.1 (1993): 125-126.

Templeton, Lieselotte K., et al. "Crystal structure of monoclinic sulfur." Inorganic Chemistry 15.8 (1976): 1999-2001.

Jung, Sung Chul, et al. "Monoclinic sulfur cathode utilizing carbon for high-performance lithium-sulfur batteries." Journal of Power Sources 325 (2016): 495-500.

Takahagi, T., et al. "XPS study on the surface structure of carbon fibers using chemical modification and C1s line shape analysis." Carbon 26.3 (1988): 389-395.

Liang, Xiao, et al. "A highly efficient polysulfide mediator for lithium-sulfur batteries." Nature Communications 6 (2015): 5682 (8 pages).

Watanabe, Y. "The crystal structure of monoclinic γ-sulphur." Acta Crystallographica Section B: Structural Crystallography and Crystal Chemistry 30.6 (1974): 1396-1401.

International Search Report and Written Opinion for corresponding International application No. PCT/US2020/013490; dated May 8, 2020 (12 pages).

Final Office Action for U.S. Appl. No. 16/900,473; dated Mar. 1, 2021 (17 pages).

Balakumar, K., et al. "High sulfur loaded carbon aerogel cathode for lithium—sulfur batteries." RSC Advances 5.43 (2015): 34008-34018.

* cited by examiner

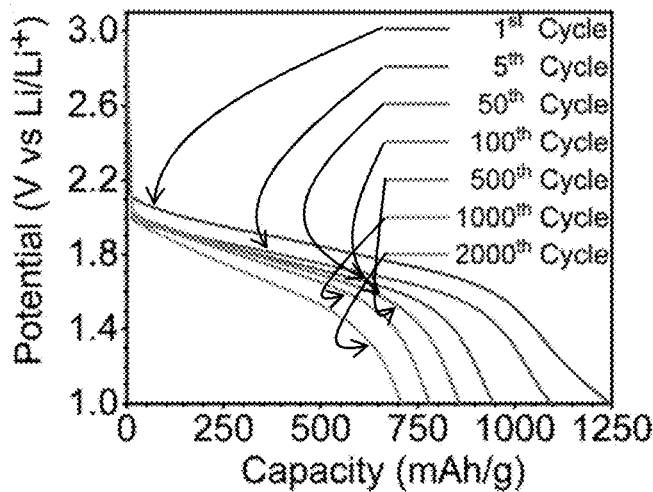
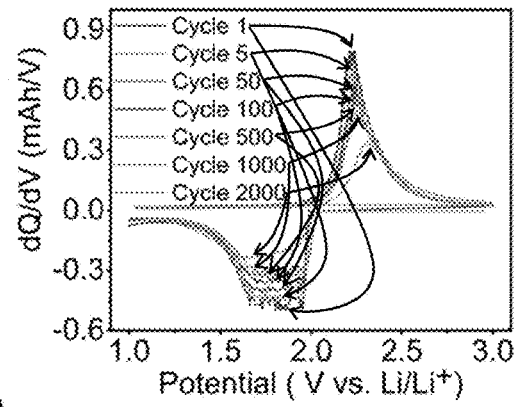
Figure 10D
Figure 10E
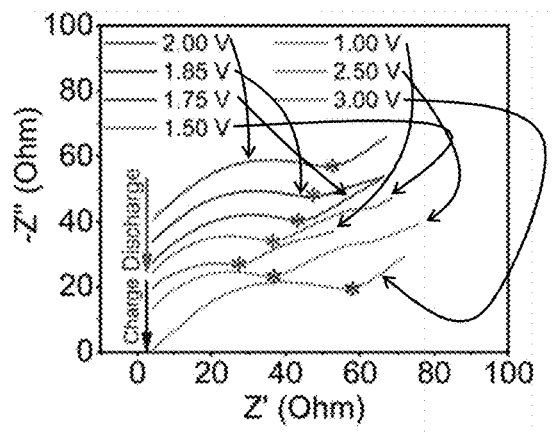
Figure 10F
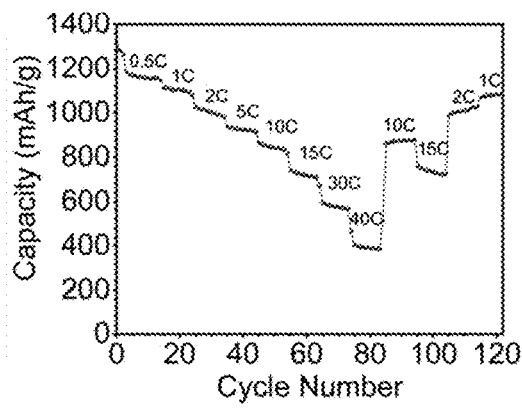
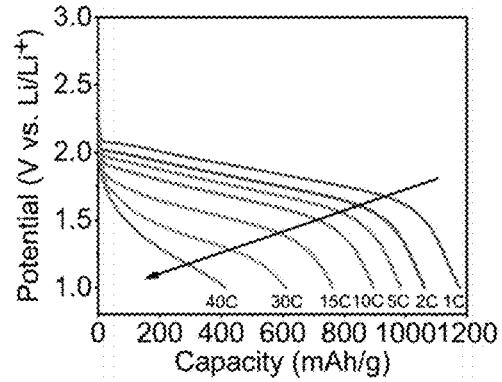
Figure 11A
Figure 11B

SYNTHESIS OF GAMMA MONOCLINIC SULFUR AND SULFUR BATTERIES CONTAINING MONOCLINIC SULFUR

CROSS REFERENCE TO RELATED APPLICATIONS

This application is a bypass continuation of International application no. PCT/US20/13490, filed on Jan. 14, 2020, which, in turn, claims the benefit of U.S. Provisional Application No. 62/792,068, filed on Jan. 14, 2019, the entire disclosures of which are hereby incorporated by reference as if set forth fully herein.

STATEMENT OF GOVERNMENT INTEREST

This invention was made with government support under Contract Number NSF-1804374 awarded by the National Science Foundation. The Government has certain rights in the invention.

BACKGROUND OF THE INVENTION

State of the art lithium-sulfur (Li—S) batteries are attractive candidates for use in hybrid electric vehicles (HEVs) and advanced portable electronic devices due to their order of magnitude higher theoretical energy density compared to conventional lithium-ion batteries (LIB)[1-4]. In addition, sulfur is both environmentally friendly and naturally abundant in the earth's crust. However, the current Li—S system is plagued by numerous challenges[5,6]. The insulating nature of both sulfur and the final discharge product, $Li_2S$ results in low material utilization during the redox processes. A bigger challenge is the dissolution of the intermediate reaction products, lithium-polysulfides (LiPs), into the electrolyte causing the well-known "shuttle-effect". Polysulfide shuttle results in uncontrollable deposition of sulfide species on the lithium metal anode, reduces coulombic efficiency, and increases capacity fade[7]. These challenges have been extensively studied in the past decade with most studies focused on ether electrolyte-based Li—S batteries[6,8,9].

A much less discussed, but extremely significant challenge for commercial viability is the use of the ether electrolyte. Ether-based solvents are highly volatile and have low flash points posing a significant risk of operating such batteries above room temperature[10-12]. For example, dimethoxyethane (DME), an important ingredient used in present day Li—S batteries, has a boiling point of only 42° C. Therefore, the practicality of such Li—S battery chemistries is doubtful due to severe safety concerns and transport issues[13].

Lithium-ion batteries have been dominant in the commercial market for the past 30 years, using carbonate-based electrolytes, well known for their reasonably safe behavior beyond room temperature (typical boiling points of >200° C.) and wide operational window[14,15]. In addition, flame retardant additives have been extensively researched, designed and applied in carbonate-based electrolytes to better enhance their reliability[16,17]. Hence, the knowledge gained on carbonate electrolytes in the Li-ion battery field over the past three decades can potentially be applied for the future development of Li—S batteries. However, it is known that when a carbonate electrolyte is used in Li—S batteries, an irreversible reaction between carbonate and polysulfides takes place to form thiocarbonate and ethylene glycol, thereby terminating further redox reactions and shutting down the battery[17]. A handful of reports have recently demonstrated the use of Li—S batteries with carbonate-based electrolytes with stable and reversible capacity[18-20]. These papers propose a few different concepts/hypotheses that potentially enable successful battery operation in carbonate electrolytes. A common feature in these works is the nano-confinement of sulfur.

For example, Xin et al. synthesized sulfur cathodes by confining sulfur molecules into 0.5 nm pores of microporous carbon host materials[19]. They proposed that the confinement within the sub-nano pores prevented the formation of larger sulfur allotropes ($S_{5-8}$) and possibly resulted in small sulfur allotropes ($S_{2-4}$) only, which in turn converted to $Li_2S$ without the intermediate polysulfides ($Li_2S_8$, $Li_2S_6$, etc.). They demonstrated stable capacity (with a single discharge plateau) in carbonate electrolyte for up to 200 cycles. However, it is not clear how the smaller allotropes exhibited a capacity close to the theoretical capacity of $S_8 \rightarrow Li_2S$ conversion.

In another work, Fu et al synthesized carbon/sulfur cathodes with sulfur confined in sub-nanometer carbon pores (0.4 nm-1 nm)[20]. This material exhibited a single plateau discharge and a stable reversible capacity for 100 cycles in carbonate electrolyte. They proposed that the small pore size forced the de-solvation of lithium ions and resulted in solid-state lithiation and de-lithiation of confined $S_8$ molecules. Overall, these works propose stringent pore size requirements (<0.5 nm) for the host carbon requiring complex synthesis procedures limiting broad deployment, while also theoretically limiting the possible sulfur loading (due to limited available volume of precisely-sized micropores). Moreover, none of these reports attempt to characterize the initial sulfur allotropes (reactants) nor the discharge or charge products formed and therefore the source of energy storage/capacity is unclear.

Commercially available ion-based batteries have reached their peak of theoretical energy density. Thus, new specific capacity materials are sought for improving the energy density of ion-based batteries. Lithium-sulfur batteries have gained significant attention owing to their promising high energy density (~2600 Wh/kg) over the traditional metal-ion batteries (~340 Wh/kg). Also, sulfur is a promising cathode material owing to its natural abundance, low adverse impact on the environment and low-cost.

Reduction of sulfur involves a multi-electron transfer redox reaction during discharge and converts to lithium sulfide and vice-versa during charge, contributing to the higher capacity and thereby higher energy density. However, state-of-the-art Li—S batteries employ ether-based electrolytes that face an array of challenges. Firstly, the intermediate discharge products (polysulfides) formed in Li—S batteries that employ the ether-based electrolytes are highly soluble in ether-based solvents and can easily transport and shuttle between the cathode and anode. This phenomenon, the "shuttle effect," results in loss of active sulfur and passivation of Li metal leading to capacity (run time) fade with cycling. Secondly, ether-based solvents are highly volatile with low flash points, thereby limiting battery application and posing a significant risk for batteries operating at elevated temperatures. Finally, the use of the most common additive, $LiNO_3$ (needed for ether-based Li—S batteries) is banned under U.S. transportation law due to issues related to the formation of explosive gases. Therefore, despite the recent development of host materials to bind polysulfides in ether-based Li—S batteries, the practical use of this electrolyte system faces significant operational and safety concerns.

The aforementioned issues of ether-based electrolytes can be circumvented by using a carbonate-based electrolyte. Carbonate-based electrolyte systems are used in used in commercial Li-ion batteries (LIBs) due to their safe and stable properties as well as their broad operating temperature window. Also, a variety of high-temperature salts have been investigated and designed for carbonate-based electrolytes for the commercial Li-ion battery market to further enhance their reliability.

However, the use of sulfur-based cathodes in combination with carbonate-based electrolytes results in the irreversible formation of undesirable by-products such as thiocarbonate and ethylene glycol, which render the battery non-functional. Recent developments in sulfur cathodes have improved systems employing carbonate-based electrolytes for Li—S and other sulfur-based batteries using alternate anodes such as Mg Na, and Ca.

Li—S batteries with carbonate electrolyte require confinement of the sulfur in nanopores. As a result, the complicated architecture required to implement these sulfur cathodes with the sulfur confined in the nanopores restricts their commercial application and reduces the sulfur loading of such batteries.

Gamma and Beta phases of sulfur are difficult to synthesize and are typically metastable at room temperature. Current methods of synthesizing gamma phase sulfur are not entirely understood with only a few articles published in the past 150 years. When exposed to ambient air, gamma monoclinic phase sulfur is expected to convert back to a stable orthorhombic structure, the most common phase of sulfur.

The use of commercially viable carbonate-based electrolytes for ion-based sulfur batteries leads to the formation of irreversible products (thiocarbonate and ethylene glycol) due to the reaction between polysulfide species and electrolyte. Recently, strategies such as confining smaller sulfur molecules ($S_2$-$S_4$) in microporous carbon (pore size<0.5 nm), crosslinking sulfur molecules to polymeric materials and formation of Solid Electrolyte Interphase (SEI) have led to use of carbonate-based electrolytes resulting in a solid to solid conversion.

Ambient temperature (about 18-25° C.) sodium-sulfur batteries (Na—S) are also known in the art and are of interest due to their theoretically high energy density and low cost. Moreover, as compared to lithium batteries, Na—S batteries avoid the use of relatively expensive Li in favor of Na.

Lithium ion batteries comprise cathodes usually made from $LiFePO_4$ (LFP), $LiMn_2O_4$ (LMO), and $LiNi_xCo_yMn_{1-x-y}O_2$ (NCM), and anode materials that may include $Li_4Ti_5O_{12}$ (LTO) and graphite (C). To test individual capacities of the cathode (NCM) and anode (Graphite), they are coupled with lithium and performance is evaluated. Further cathodes such as NCM and graphite are coupled to form a full cell. The voltage window of Li∥NCM is 3-4 V and Li∥graphite is 0.6-0.01V and the coupled voltage window is 3-3.5 V. Hence, when sulfur cathodes are coupled with different metal oxide/graphite anodes, the voltage window is typically different.

Ambient temperature sodium-batteries, potassium-batteries, magnesium-batteries, and calcium-batteries may comprise a cathode including sulfur, an anode including sodium, potassium, magnesium, or calcium, and an electrolyte. Generally, during the battery discharge cycle, polysulfides are reduced on the cathode surface and during the battery charging cycle, polysulfides are formed at the cathode. For example:

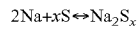

$$2Na + xS \leftrightarrow Na_2S_x$$

Similar to i-S batteries, room temperature sodium-batteries face problems associated with achieving charge capacity close to theoretical and retaining charge with repeated cycling. As such, commercially available Na—S batteries typically operate at temperatures of 300-350° C. so that they may employ molten sodium and sulfur phases in conjunction with a solid, ceramic electrolyte in order to mitigate the shuttle-effect.

Potassium-batteries, magnesium-batteries, and calcium-batteries pose similar problems as sodium-batteries. Specifically, potassium-batteries are larger and thus experience even more significant problems.

SUMMARY OF THE INVENTION

In a first aspect, the present invention relates to a method of depositing monoclinic sulfur on a substrate. In the method, monoclinic phase sulfur that is stable at a temperature below 80° C. is deposited via vapor deposition onto a substrate which may be a porous material in a sealed vapor deposition apparatus at a temperature sufficient to vaporize the sulfur and for a time sufficient to provide the monoclinic phase sulfur, and the monoclinic phase sulfur deposited on the substrate is cooled to a temperature of 0-50° C. or 15-40° C. or 18-25° C.

In the method, a cathode suitable for use in an electrode of a cell or battery may be produced.

In each of the foregoing embodiments, a loading of the monoclinic phase sulfur on the substrate of at least 0.05 mg/cm², or at least 0.5 mg/cm², can be provided.

In the foregoing embodiment, the heating step may be carried out at a temperature of from 140° C. to about 350° C., or from 140° C. to 250° C., or from 150° C. to 210° C., or from 160° C. to 190° C., or at about 175° C.

In each of the foregoing embodiments, the heating step may be carried out for a period of at least about 1 minute, or from 1 minute to 1000 hours, or 1 minute to 48 hours, or from 10 to 30 hours, or from 20 to 28 hours, or for about 24 hours.

In each of the foregoing embodiments, the cooling step may be carried out by exposing the vapor deposition apparatus or the sample to a temperature of equal to or less than 50° C., or from about −20° C. to about 25° C. or from 0° C. to about 25° C., or from about 20° C. to about 25° C., or from about 20° C. to 22° C.

In each of the foregoing embodiments, the vapor deposition apparatus may be cooled immediately upon completion of the heating step.

In each of the foregoing embodiments, the substrate may be a porous material having a pore volume of 10-95%, after the step of depositing the monoclinic phase sulfur.

In each of the foregoing embodiments, the substrate may be conductive or non-conductive. In each of the foregoing embodiments, the substrate may include carbon nanofibers such as a mat of carbon nanofibers or free-standing carbon nanofibers.

In each of the foregoing embodiments, the substrate may be located in the vapor deposition apparatus with a gap between the surface of a liquid sulfur reservoir and the substrate such that the substrate does not come into contact with liquid sulfur during the vapor deposition step.

In each of the foregoing embodiments of the method, the monoclinic phase sulfur may comprise a form of sulfur selected from the group consisting of monoclinic gamma phase sulfur; monoclinic sulfur that best matches monoclinic gamma phase sulfur using PDXL Version 2.8.4.0 Integrated Powder Diffraction Software; monoclinic gamma phase sulfur oriented in the k direction; and monoclinic sulfur that best matches monoclinic gamma phase sulfur oriented in the k direction using PDXL Version 2.8.4.0 Integrated Powder Diffraction Software.

In a second aspect, the present invention relates to a cathode which may, for example, be prepared by any of the foregoing methods.

In another aspect, the present invention relates to a cathode including monoclinic phase sulfur that is stable at a temperature below 80° C. located on a substrate which may be a porous material. In this embodiment, the monoclinic phase sulfur may optionally be deposited on the substrate by vapor deposition.

In each of the foregoing embodiments, the monoclinic phase sulfur may comprise a form of sulfur selected from the group consisting of monoclinic gamma phase sulfur; monoclinic sulfur that best matches monoclinic gamma phase sulfur using PDXL Version 2.8.4.0 Integrated Powder Diffraction Software; monoclinic gamma phase sulfur oriented in the k direction; and monoclinic sulfur that best matches monoclinic gamma phase sulfur oriented in the k direction using PDXL Version 2.8.4.0 Integrated Powder Diffraction Software; monoclinic cyclo-hexa-cyclo-deca sulfur and monoclinic sulfur that best matches to cyclo-decasulfur-cyclo-hexasulfur using the PDXL Version 2.8.4.0 Integrated Powder Diffraction Software.

In each of the foregoing embodiments of the cathode, the substrate may be conductive, non-conductive, and may comprise carbon nanofibers such as a mat of carbon nanofibers or free-standing carbon nanofibers.

In each of the foregoing embodiments of the cathode, the cathode may have an initial discharge capacity in a range of from about 300 mAh/g to about 2500 mAh/g, or from about 350 mAh/g to about 2000 mAh/g, or from about 375 mAh/g to about 1700 mAh/g, or from about 400 mAh/g to about 1300 mAh/g, or from about 600 mAh/g to about 1100 mAh/g, or from about 750 mAh/g to 900 mAh/g, or 800 mAh/g, based on a total weight of sulfur in the cathode.

In each of the foregoing embodiments of the cathode, the cathode may include a cathode current collector.

In each of the foregoing embodiments of the cathode, the cathode may have a monoclinic phase sulfur loading in a range of at least 0.05 mg/cm$^2$, or at least 0.5 mg/cm$^2$ from about 1.0 mg/cm$^2$ to about 150.0 mg/cm$^2$ or from about 5.0 mg/cm$^2$ to about 125 mg/cm$^2$, or from about 10 mg/cm$^2$ to about 115 mg/cm$^2$.

In each of the foregoing embodiments of the cathode, the substrate may be a porous material having a pore volume of 10-95%, measured after the monoclinic phase sulfur is present on the cathode.

In another aspect, the invention relates to a sulfur cell including any one of the foregoing embodiments of the cathode, an anode, and an electrolyte. The electrolyte may be a carbonate electrolyte. The carbonate electrolyte may be selected from ethylene carbonate, dimethylcarbonate, methylethyl carbonate, diethylcarbonate, propylene carbonate, vinylene carbonate, allyl ethyl carbonate, and mixtures thereof. Preferably, in each of the foregoing embodiments of the sulfur battery, the carbonate electrolyte may be selected from ethylene carbonate, diethyl carbonate, propylene carbonate and mixtures thereof.

In each of the foregoing embodiments of the cell, the anode may be an ion reservoir including an active material selected from alkali metals, alkaline earth metals, transition metals, graphite, alloys, and composites. In some embodiments, the anode includes an active material selected from lithium, sodium, potassium, magnesium, calcium, zinc, copper, titanium, nickel, cobalt, iron, or aluminum.

In each of the foregoing embodiments of the cell, the cell may be a lithium-sulfur cell, a sodium-sulfur cell, a potassium-sulfur cell, a magnesium-sulfur cell, and a calcium-sulfur cell.

In each of the foregoing embodiments of the cell, the cell may exhibit a single plateau discharge curve with a discharge capacity of from 300 mAh/g to about 1700 mAh/g, or from about 400 mAh/g to about 1300 mAh/g, or from about 600 mAh/g to about 1100 mAh/g, or from about 750 mAh/g to 900 mAh/g, or 800 mAh/g after 1000 cycles at a C/2 rate, all based on a total weight of the sulfur in the cathode, or the cell exhibits a single plateau discharge curve with a discharge capacity of from about 300 mAh/g to about 3000 mAh/g, or from about 400 to about 2500 mAh/g after a first cycle at a C/10 rate, all based on a total weight of the sulfur in the cathode.

In each of the foregoing embodiments of the cell, the cell may have a discharge capacity of from about 100 mAh/g to about 1500 mAh/g, or from about 400 mAh/g to about 1200 mAh/g, or from about 600 mAh/g to about 900 mAh/g, or from about 650 mAh/g to 750 mAh/g, after 1300 cycles at a C/2 rate, all based on a total weight of the sulfur in the cathode.

In each of the foregoing embodiments of the cell, the cell may be a rechargeable cell.

In each of the foregoing embodiments of the cell, the cell may include a current collector.

In another aspect, the present invention relates to a sulfur battery including a plurality of the sulfur cells as described in each of the foregoing embodiments.

In each of the embodiments of the sulfur battery, the sulfur battery may include porous separator, where the separator is provided between an anodic section and a cathodic section of the battery. The porous separator may be selected from a porous polypropylene membrane, cotton, nylon, polyesters, glass fiber, polyethylene, poly(tetrafluoroethylene, polyvinyl chloride, anodic aluminum oxide (AAO) and rubber.

The present invention provides both a novel material for use in the cathode of a sulfur cell or battery namely, a monoclinic phase sulfur that is stable at a temperature below 80° C., such as a monoclinic gamma phase sulfur, and a novel approach that does not require confinement of the sulfur in such sulfur batteries. The monoclinic phase sulfur was synthesized and deposited using vapor deposition on the surface of a substrate which may be a porous material including carbon nanofibers such as a mat of carbon nanofibers or free-standing carbon nanofibers.

Free standing carbon nanofibers deposited with gamma monoclinic phase sulfur electrodes: (a) allow use of carbonate-based electrolytes, (b) yield a solid to solid transition and thereby avoiding polysulfide formation, (c) form a stabilized gamma phase that remains stable for long periods in ambient air, (d) eliminate the need for the dead weight of binders and collectors, (e) maintain conductive carbon challenges for better electron pathways, and (f) provide excellent mechanical stability during cycling. Further, the method of forming/depositing the gamma monoclinic phase sulfur can be employed for large-scale development of gamma phase and its use in sulfur batteries.

Additional details and advantages of the disclosure will be set forth in part in the description which follows, and/or may be learned by practice of the disclosure. The details and advantages of the disclosure may be realized and attained by means of the elements and combinations particularly pointed out in the appended claims. It is to be understood that both the foregoing general description and the following detailed description are exemplary and explanatory only and are not restrictive of the disclosure, as claimed.

BRIEF DESCRIPTION OF THE DRAWINGS

FIG. 6A is a perspective view of the vapor deposition assembly, including the autoclave lid and autoclave chamber.

FIG. 6B is a cross-sectional view of the vapor deposition assembly of FIG. 6A, taken along line A-A of FIG. 6A.

FIG. 6C is cross-sectional view of the vapor deposition assembly of FIG. 6A, taken along line B-B of FIG. 6A.

FIG. 8A shows SEM images of CNFs before sulfur deposition.

FIG. 8B shows SEM images of CNFs after gamma sulfur deposition. The inset is an enlarged image of well-deposited gamma sulfur particles of CNFs.

FIG. 8C shows a cross-sectional SEM image of CNFs after sulfur deposition showing gamma sulfur deposited throughout the cathode.

FIG. 8D shows the pore size distribution of CNFs before and after gamma sulfur deposition.

FIG. 8E shows isotherms obtained before and after gamma sulfur deposition on CNFs.

FIG. 8F shows a TGA curve of gamma sulfur deposited CNFs in an argon environment.

FIG. 9A shows an X-ray diffraction (XRD) pattern of CNFs and gamma sulfur deposited CNFs.

FIGS. 9B-9C show SEM images of gamma sulfur deposited CNFs showing well-distributed gamma sulfur deposition and EDS elemental mapping.

FIGS. 9D-9F show the X-ray photoelectron spectroscopy (XPS) spectra of S, O, and C on the gamma sulfur deposited CNFs (after deposition of Sulfur).

FIGS. 10A-10F show the electrochemical characterization of gamma sulfur deposited CNFs.

FIG. 10A shows charge-discharge patterns of gamma sulfur deposited CNFs in and ether electrolyte, 1,2-dimethoxyethane:1,3-dioxolane (DME:DOL) and a carbonate electrolyte, ethylene carbonate:diethylcarbonate (EC:DEC).

FIG. 10B shows cyclic voltammetry curves of gamma sulfur deposited CNFs in an ether electrolyte (DME:DOL) and a carbonate electrolyte (EC:DEC).

FIG. 10C shows the cycling stability of gamma sulfur deposited CNFs in an EC:DEC electrolyte at a current rate of 0.5 C.

FIG. 10D shows the discharge capacity of gamma sulfur deposited CNFs at various numbers of cycles.

FIG. 10E shows a differential capacity analysis plot of gamma sulfur deposited CNFs displaying a single peak in the charge-discharge cycle.

FIG. 10F shows a Nyquist plot of gamma sulfur deposited CNFs cathode as a function of voltage during the charge-discharge cycle.

FIGS. 11A-11D show the rate performance and high loading analysis of gamma sulfur deposited CNFs.

FIG. 11A shows the rate performance of gamma sulfur deposited CNFs in carbonate electrolyte.

FIG. 11B shows the discharge profiles of gamma sulfur deposited CNFs at various C rates.

FIG. 11C shows long cycling of gamma sulfur deposited CNFs at low current rate 0.1 C at 1.2 mg/cm$^2$ loading.

FIG. 11D shows long cycling of gamma sulfur deposited CNFs as a function of high loading.

FIG. 12A shows a SEM image of gamma sulfur deposited CNFs after 20 discharge cycles.

FIG. 12B shows a SEM image of gamma sulfur deposited CNFs after 20 charge cycles.

FIG. 13A shows an XRD pattern of pristine gamma sulfur deposited CNFs.

FIG. 13B shows an XRD pattern of discharged gamma sulfur deposited CNFs showing conversion to $Li_2S$.

FIG. 13C shows a charged spectrum of a battery that was charged and subsequently the electrode was removed from the battery, showing conversion to monoclinic cyclo-hexa-cyclo-deca sulfur.

FIG. 13D shows a typical charge-discharge voltage profile obtained in the samples and the specific points where spectroscopy data was collected.

FIG. 13E shows high resolution S2p XPS spectra of pristine gamma sulfur deposited CNFs.

FIG. 13F shows high resolution S2p XPS spectra of discharged gamma sulfur deposited CNFs displaying an $Li_2S$ peak.

FIG. 13G shows high resolution S2p XPS spectra of charged gamma sulfur deposited CNFs showing the presence of a sulfur peak.

DETAILED DESCRIPTION OF THE PREFERRED EMBODIMENTS

In the present invention, a rare phase of sulfur—the monoclinic gamma phase sulfur (Rosykite)—is provided in a stable form on a support. This enables successful operation of sulfur cells and batteries in a carbonate electrolyte for up to or more than 4000 cycles. Electrochemical characterizations via galvanostatic charge-discharge tests, cyclic voltammetry, differential capacity and in-operando EIS measurements suggest a redox mechanism that consistently eliminates intermediate polysulfides over the entire 2000 cycles, thus preventing adverse reactions with the electrolyte.

Thus, in one embodiment, the present invention relates to a cathode that includes monoclinic gamma phase sulfur that is stable at temperatures up to 80° C., or at temperatures of from 0° C. to 80° C., or from 15° C. to 50° C., or from 18° C. to 40° C., The monoclinic gamma phase sulfur can be identified by a best match to PDF Card No.: 00-013-0141 Quality:B for Rosickyite, monoclinic gamma phase sulfur, optionally using the PDXL Version 2.8.4.0 (Integrated Powder Diffraction Software by Rigaku) database of XRD patterns to match the XRD pattern for this phase of sulfur. The monoclinic gamma phase sulfur can also be identified by a best match to monoclinic gamma phase sulfur using the PDXL Version 2.8.4.0 (Integrated Powder Diffraction Software by Rigaku) database of XRD patterns to match the XRD pattern for this phase of sulfur.

Figure 20:
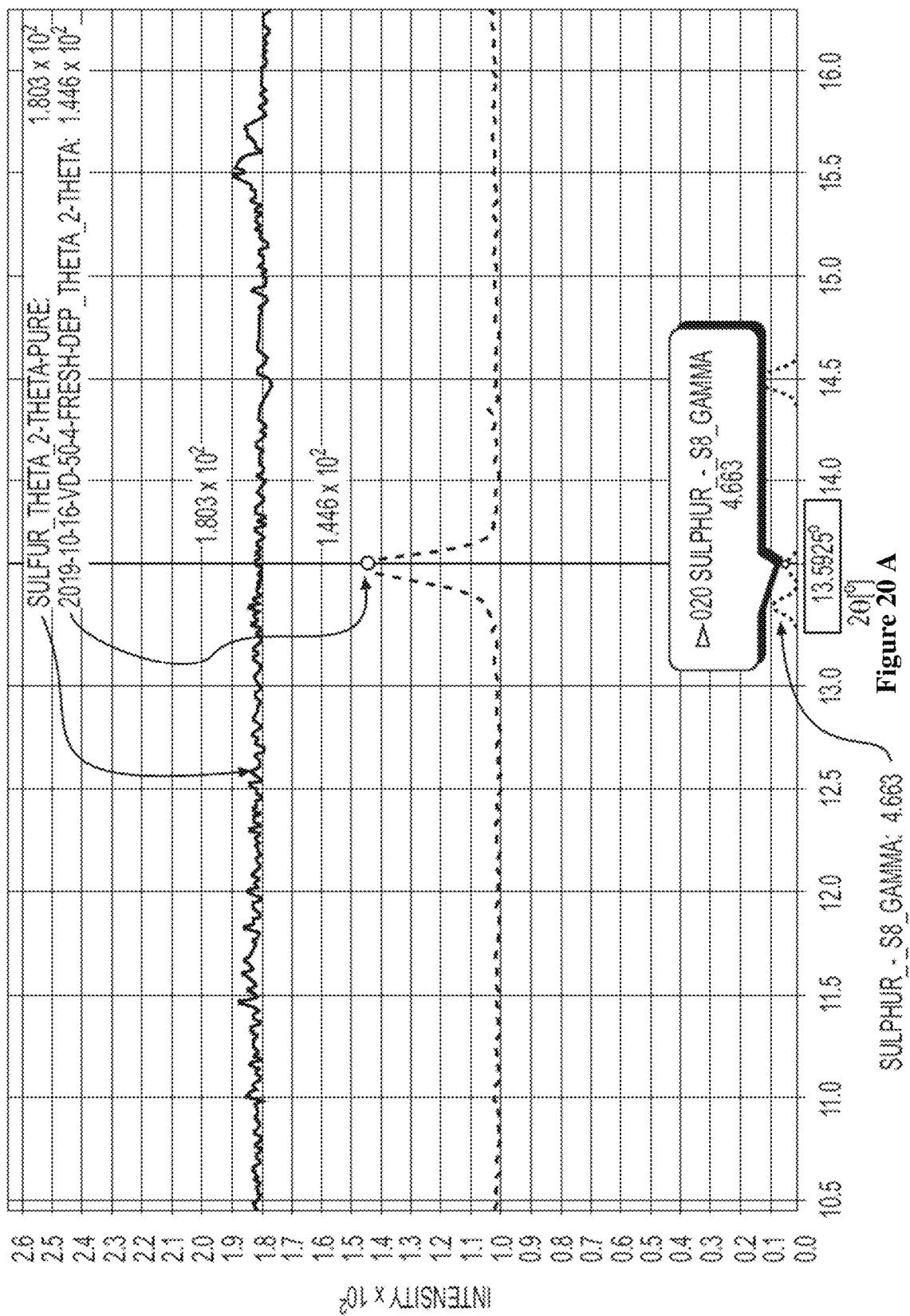
FIGS. 20A-20B show comparisons of:
1. pure alpha orthorhombic sulfur,
2. monoclinic gamma phase sulfur of the invention, and
3. the gamma sulfur.cif file from the National Institute for Materials Science (NIMS) Materials Database discussed in Watanabe, Yasunari, "The Crystal Structure of Monoclinic γ-Sulphur," Acta Cryst. (1974), B30, 1396, The NIMS Material Database can be found at https://mits.nims.go.jp/index_en.html).
Figure 20:
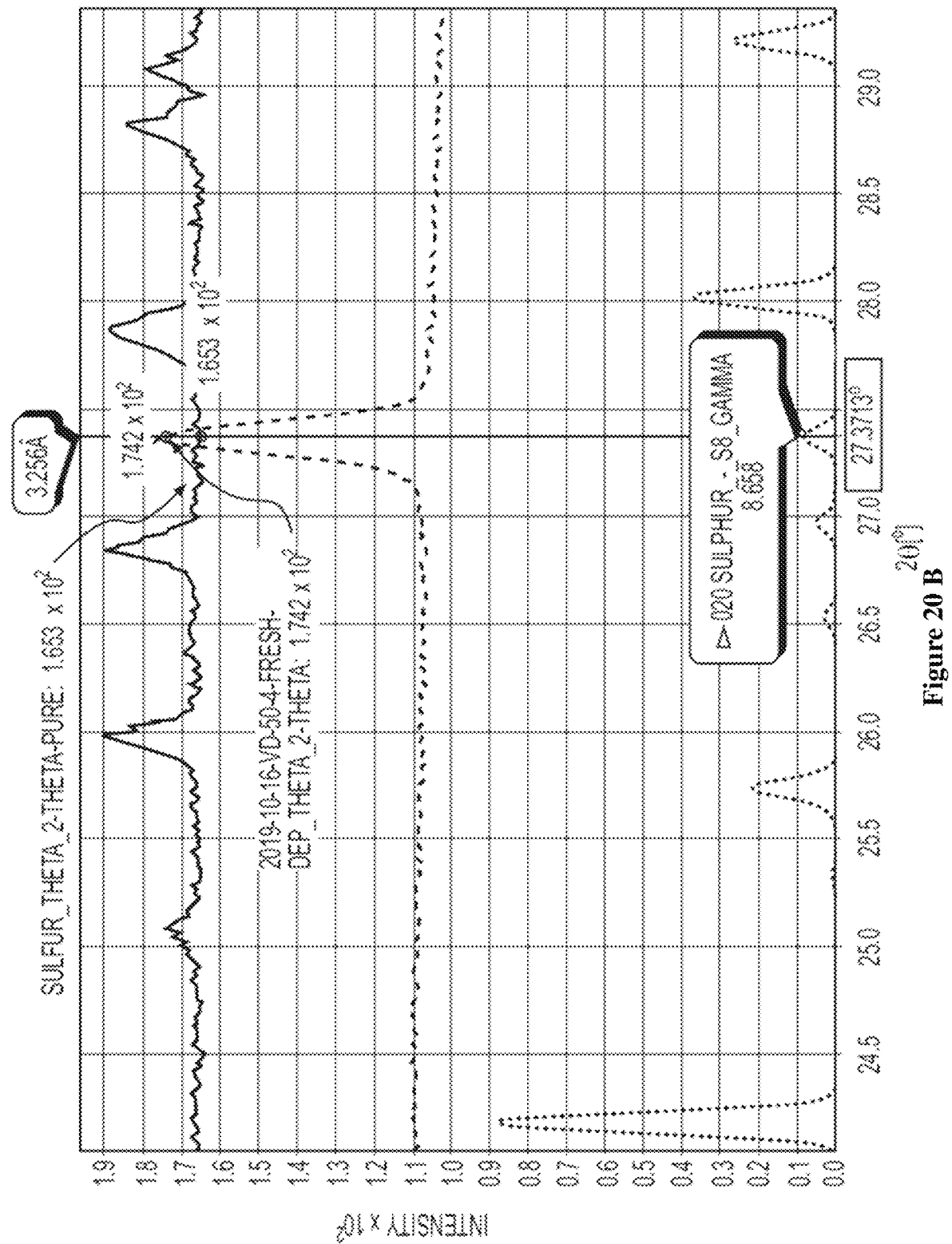

The XRD patterns of FIGS. 20A-20B show comparisons of:
1. pure alpha orthorhombic sulfur,
2. monoclinic gamma phase sulfur of the invention, an
3. the gamma sulfur.cif file from the National Institute for Materials Science (NIMS) Materials Database discussed in Watanabe, Yasunari, "The Crystal Structure of Monoclinic γ-Sulphur," Acta Cryst. (1974), B30, 1396, The NIMS Material Database can be found at https://mits.nims.go.jp/index_en.html). In FIGS. 20A-20B peaks of monoclinic gamma phase sulfur seen at 13.59+/−0.02 match exactly with 020 (hkl) peaks of monoclinic gamma phase sulfur from the database. Alpha phase sulfur has no peaks in this region. Similarly, the monoclinic gamma phase sulfur has a peak at 040 (hkl) which does not over-lap with orthorhombic sulfur, further suggesting preferential orientation of the monoclinic gamma phase sulfur in the k direction.

In addition, none of the vapor deposited monoclinic gamma phase sulfur peaks match with the alpha orthorhombic phase. Also, in the database, the monoclinic gamma phase sulfur peaks do not overlap with any alpha orthorhombic phase. This supports a conclusion that the peaks of gamma sulfur are unique in the hkl direction (010), (020), (030), (040) . . . (090) when compared to the crystal structure database.

Further when the database gamma monoclinic phase is compared with the beta monoclinic phase none of the peaks and their corresponding intensities match with each other.

Post mortem studies of cycled cells using XRD, XPS and TEM found redox products after charge and discharge cycles including clear evidence for the formation of $Li_2S$ at the end of the discharge cycle. In addition, these studies indicate that the sulfur rearranges itself to yet another uncommon phase—cyclo-deca-cyclo-hexa sulfur, also belonging to the monoclinic crystal structure family, after the first charge. Nevertheless, no effect of such phase shift is seen on the electrochemical redox behavior as shown by galvanostatic charge-discharge tests. This seems to be the first report of these types of stable sulfur crystal structures in Li—S cells or batteries and their operation in carbonate electrolyte.

The cyclo=deca-cyclo-hexa monoclinic phase sulfur may be identified by a best match to PDF Card No.: 01-072-4584 Quality:S for cyclo-decasulfur-cyclo-hexasulfur, optionally using the PDXL Version 2.8.4.0 (Integrated Powder Diffraction Software by Rigaku) database of XRD patterns to match the XRD pattern for this phase of sulfur. Alternatively, the cyclo=deca-cyclo-hexa monoclinic phase sulfur may be identified by a best match to cyclo-decasulfur-cyclo-hexasulfur, using the PDXL Version 2.8.4.0 (Integrated Powder Diffraction Software by Rigaku) database of XRD patterns to match the XRD pattern for this phase of sulfur.

By "best match" in the context of using the software to match a PDF card is meant a type of best match algorithm which determines the best match of a particular XRD patent to one of the PDF cards for forms of sulfur. Thus, as demonstrated below, not all peaks of the XRD patent must match the pattern on the PDF card and not all peaks on the PDF care must be present for there to be a match. Rather, if the specified software determines that the XRD pattern of a particular material is a best match to the specified PDF card, then the sulfur for which the XRD pattern has been obtained is considered to be within the scope of the present invention.

As seen from the SEM images, FIGS. 3A-3D, 8B, 9B-9C, and 12A-12C show the that the gamma monoclinic phase sulfur is non-confined as it shows blocks of sulfur in-between the interfiber carbon-nanofiber spacing. The XRD data shows the presence of crystalline peaks denoting the presence of gamma monoclinic phase sulfur on CNFs. See FIGS. 9a, 13A-13B, and 14D. The present invention employs a porous material thus, a partial deposition of sulfur might take place in the pores. Current methods employing carbonate electrolyte are only effective when sulfur is confined, in contrast, the electrodes of the present invention are capable of working despite being non-confined. The inventors theorize that this is due to gamma monoclinic gamma phase of sulfur.

In the present invention, gamma monoclinic phase sulfur is synthesized/deposited on a support for a cathode of a sulfur cell. Despite an exposed un-confined deposition of this sulfur phase on a substrate, carbonate-based cells employing this sulfur phase exhibit a high reversible capacity of, for example, 700 mAh/g after 2000 cycles, or 550 mAh/g after 4000 cycles, both at C/2 rate, or 550 mAh/g after 800 cycles at C/10. Li—S electrodes with this sulfur phase also exhibit a high rate performance up to a 40 C rate and a high areal loading of sulfur of up to 5 mg/cm$^2$. The electrode may consist of freestanding, binder and current collector-free carbon nanofibers. After sulfur deposition and slow cooling at room temperature in an autoclave, the sulfur adopts the uncommon monoclinic gamma phase structure rather than the typical orthorhombic alpha phase, even on the external surface of a substrate such as carbon nanofibers. This monoclinic gamma phase remains stable at room temperature for over a year with no apparent evidence of a phase change even beyond this timeframe. Extensive electrochemical characterization and post mortem spectroscopy/microscopy studies on cycled cells reveal an altered redox mechanism that reversibly converts monoclinic sulfur to Li$_2$S without the formation of intermediate polysulfides over up to and beyond 2000 cycles. The development of non-confined high loading sulfur cathodes for use in batteries employing carbonate-based electrolytes can revolutionize the field of high energy density practical batteries.

The present invention employs a monoclinic gamma phase sulfur that enables a single plateau lithium-sulfur reaction in, for example, a carbonate electrolyte system. This system avoids the formation of polysulfides during charge-discharge. As a result, it is expected that the monoclinic gamma phase sulfur will have a long cycle life in a battery, even if a carbonate electrolyte system is employed.

Method for Preparing a Cathode Via Vapor Deposition

In one embodiment, the gamma monoclinic phase sulfur may be deposited on a substrate via vapor deposition. Vapor deposition is carried out in a sealed vapor deposition apparatus at a temperature sufficient to vaporize sulfur and for a time sufficient to provide gamma monoclinic phase sulfur. Once the gamma monoclinic phase sulfur is deposited on the substrate, it is cooled to ambient temperature of about 18-25° C. Preferably, the sulfur loading on the substrate is at least 0.05 mg/cm$^2$. For this purpose, it may be desirable to employ a porous substrate in order to increase the surface area of the substrate available for sulfur deposition.

Suitable temperatures for carrying out the vapor deposition may range from about 140° C. to 350° C., or from 140° C. to 250° C., or from 150° C. to 210° C., or from 160° C. to 190° C., or at about 175° C. Preferably, the vapor deposition is carried out for a period of at least about 1 minute, or from 1 minute to 1000 hours, or 1 minute to 48 hours, or from 10 to 30 hours, or from 20 to 28 hours, or for about 24 hours.

The vapor deposition step is followed by a step of cooling, which may be carried out by exposing the vapor deposition apparatus or the sample to a temperature of less than 50° C., or an environmental temperature of less than 25° C., or from about −20° C. to about 25° C. or from 0° C. to about 25° C., or from about 20° C. to about 25° C., or from about 20° C. to 22° C. In some embodiments, the vapor deposition apparatus is cooled immediately upon completion of the vapor deposition step.

The porous material employed for the substrate in the present invention may be conductive or non-conductive, and preferably is selected from a substrate comprising carbon nanofibers, a mat of carbon nanofibers, free-standing carbon nanofibers, conductive carbon powders, carbon nanotubes, graphene, and carbide-derived carbons. After the step of depositing the gamma monoclinic phase sulfur, the porous material may have a pore volume of 10-95%. Furthermore, during the method and particularly the vapor deposition step, the porous material is preferably located in the vapor deposition apparatus such that the porous material does not contact with the liquid sulfur.

The Cathode

The cathode of the present invention may be prepared by the method of depositing gamma monoclinic phase sulfur via vapor deposition onto a substrate as described above. The pristine cathode includes monoclinic gamma monoclinic phase sulfur on a substrate. The gamma monoclinic phase sulfur loading on the cathode may be in a range of from about 1.0 mg/cm$^2$ to about 150 mg/cm$^2$ or from about 5 mg/cm$^2$ to about 125 mg/cm$^2$ or from about 10 mg/cm$^2$ to about 115 mg/cm$^2$, or at least from about 25 mg/cm$^2$.

The cathode may have an initial discharge capacity in a range of from about 300 mAh/g to about 2500 mAh/g, or from about 350 mAh/g to about 2000 mAh/g, or from about 375 mAh/g to about 1700 mAh/g, or from about 400 mAh/g to about 1300 mAh/g, or from about 600 mAh/g to about 1100 mAh/g, or from about 750 mAh/g to 900 mAh/g, or 800 mAh/g, based on a total weight of the sulfur in the cathode.

The cathode of the present invention may optionally include a cathode current collector though a current collector will not typically be required.

The Anode

The anodes of the present invention are ion reservoirs, optionally including an active material selected from alkali metals, alkaline metals, transition metals, graphite, alloys, and compositions.

Suitable examples of active materials may be selected from lithium, sodium, potassium, magnesium, calcium, zinc, copper, titanium, nickel, cobalt, iron, aluminum, silicon, germanium, tin, lead, antimony, bismuth, manganese, and cadmium, and lithiated versions thereof. The active materials of the anodes may also be alloys or intermetallic selected from compounds of lithium, sodium, potassium, magnesium, calcium, zinc, copper, titanium, nickel, cobalt, iron, aluminum, silicon, germanium, tin, lead, antimony, bismuth, manganese, and cadmium, and lithiated versions thereof, where the alloys or compounds are stoichiometric or non-stoichiometric.

In some embodiments the active materials of the anode may be oxides, carbides, nitrides, sulfides, phosphides, selenides, and tellurides of lithium, sodium, potassium, magnesium, calcium, zinc, copper, titanium, nickel, cobalt, iron, aluminum, silicon, germanium, tin, lead, antimony, bismuth, manganese, and cadmium, and their mixtures or composites, and lithiated versions thereof.

In some embodiments, the active materials of the anodes may be salts and hydroxides of selenides and lithiated versions thereof, or carbon or graphite materials and pre-lithiated versions thereof; and combinations thereof.

Preferably, the anode in the sulfur cells may include an active material selected from lithium, sodium, potassium, magnesium, calcium, zinc, copper, titanium, nickel, cobalt, iron, or aluminum. Preferably, the cell is a lithium-sulfur cell, a sodium-sulfur cell, a potassium-sulfur cell, a magnesium-sulfur cell, and a calcium-sulfur cell, and even more preferably, the cell is selected from a lithium-sulfur cell, sodium-sulfur cell, and a potassium-sulfur cell.

The Cells

The sulfur cells of the present invention include the cathodes of the present invention in combination with an anode.

The cells of the present invention may exhibit a single plateau discharge curve with a discharge capacity of from 300 mAh/g to about 1700 mAh/g, or from about 400 mAh/g to about 1300 mAh/g, or from about 600 mAh/g to about 1100 mAh/g, or from about 750 mAh/g to 900 mAh/g, or 800 mAh/g after 1000 cycles at a C/2 rate, all based on a total weight of the sulfur in the cathode.

The cells of the present invention may also exhibit a single plateau discharge curve with a discharge capacity of from about 300 mAh/g to about 3000 mAh/g, or from about 400 to about 2500 mAh/g after a first cycle at a C/10 rate, all based on a total weight of the sulfur in the cathode.

The cells of the present invention also have a discharge capacity of from about 100 mAh/g to about 1500 mAh/g, or from about 400 mAh/g to about 1200 mAh/g, or from about 600 mAh/g to about 900 mAh/g, or from about 650 mAh/g to 750 mAh/g, after 1300 cycles at a C/2 rate, all based on a total weight of the sulfur in the cathode.

The cell may also include an electrolyte. Suitable electrolytes for use in the cell of the present invention are carbonate electrolytes and ether electrolytes. Preferably, the electrolytes are carbonate electrolytes and the carbonate electrolytes may be selected ethylene carbonate, dimethylcarbonate, methylethyl carbonate, diethylcarbonate, propylene carbonate, vinylene carbonate, allyl ethyl carbonate, and mixtures thereof. More preferably, the carbonate electrolyte is selected from ethylene carbonate, diethyl carbonate, propylene carbonate and mixtures thereof.

Generally, the anodes employed in the sulfur cell is an ion reservoir including an active material selected from alkali metals, alkaline earth metals, transition metals, graphite, alloys, and composites. In some embodiments, the anode has an active material selected from lithium, sodium, potassium, magnesium, zinc, copper, titanium, nickel, cobalt, iron, calcium, or aluminum. Preferably, the battery is a lithium-sulfur cell, a sodium-sulfur cell, a magnesium-sulfur cell, a potassium-sulfur cell and a calcium-sulfur cell, and even more preferably, the battery is selected from a lithium-sulfur cell, sodium-sulfur cell, and a potassium-sulfur cell.

The cell is preferably a rechargeable cell. The cell may optionally include one or both of a current collector and a cathode current collector.

Batteries

The sulfur battery of the present invention includes a plurality of the sulfur cells according to the present invention.

Suitable electrolytes to be used in the battery of the present invention are carbonate electrolytes. Preferably, the carbonate electrolyte is selected from ethylene carbonate, dimethylcarbonate, methylethyl carbonate, diethylcarbonate, propylene carbonate, vinylene carbonate, allyl ethyl carbonate, and mixtures thereof. More preferably, the carbonate electrolyte is selected from ethylene carbonate, diethyl carbonate, propylene carbonate and mixtures thereof.

Generally, the anodes employed in the sulfur battery is an ion reservoir including an active material selected from alkali metals, alkaline earth metals, transition metals, graphite, alloys, and composites. In some embodiments, the anode includes an active material selected from lithium, sodium, potassium, magnesium, zinc, copper, titanium, nickel, cobalt, iron, calcium, or aluminum. Preferably, the battery is a lithium-sulfur battery, a sodium-sulfur battery, a magnesium-sulfur battery, a potassium-sulfur battery and a calcium-sulfur battery, and even more preferably, the battery is selected from a lithium-sulfur battery, sodium-sulfur battery, and a potassium-sulfur battery.

The batteries of the present invention exhibit a single plateau discharge curve with a discharge capacity of from 300 mAh/g to about 1700 mAh/g, or from about 400 mAh/g to about 1300 mAh/g, or from about 600 mAh/g to about 1100 mAh/g, or from about 750 mAh/g to 900 mAh/g, or 800 mAh/g after 1000 cycles at a C/2 rate, all based on a total weight of the sulfur in the cathode.

The batteries of the present invention may also exhibit a single plateau discharge curve with a discharge capacity of from about 300 mAh/g to about 3000 mAh/g, or from about 400 to about 2500 mAh/g after a first cycle at a C/10 rate, all based on a total weight of the sulfur in the cathode.

The batteries of the present invention also have a discharge capacity of from about 100 mAh/g to about 1500 mAh/g, or from about 400 mAh/g to about 1200 mAh/g, or from about 600 mAh/g to about 900 mAh/g, or from about 650 mAh/g to 750 mAh/g, after 1300 cycles at a C/2 rate, all based on a total weight of the sulfur in the cathode.

The batteries of the present invention have the advantage that they are capable of operating below 250° C., more preferably, below 150° C., or below 100° C. or bellow 50° C. or below 25° C.

Preferably, the battery is a rechargeable battery. The battery described herein may optionally include one or both of a current collector and a cathode current collector.

The battery of the present invention may further include a separator, such as a porous separator, provided between an anodic section and a cathodic section of the battery. Preferably, the porous separator is a porous material, such as a polypropylene membrane, cotton, nylon, polyesters, glass fiber, polyethylene, poly(tetrafluoroethylene), polyvinyl chloride, anodic aluminum oxide (AAO), and rubber.

The batteries of the present invention may be used in downstream products, such as electronic devices, for example, vehicles, laptop computers, notebook personal computers, tablet computer, mobile phones (for example, smart phones and the like), personal digital assistants (PDA), display devices (LCD, EL display, electronic paper, and the like), imaging devices (for example, digital still camera, digital video camera, and the like, audio devices (for examples, portable audio player), a game machine, a cordless handset, an electronic book, an electronic dictionary, a radio, headphones, a navigation system, a memory card, a pacemaker, a hearing aid, an electric tool, an electric shaver, a refrigerator, an air conditioner, a television, a stereo, a water heater, a microwave oven, a dishwasher, a washing machine, a dryer, a lighting device, a toy, a medical device, a robot, a road conditioner, a traffic light, and the like, but are not limited thereto.

Synthesis and Fabrication Procedures

Figure 1:
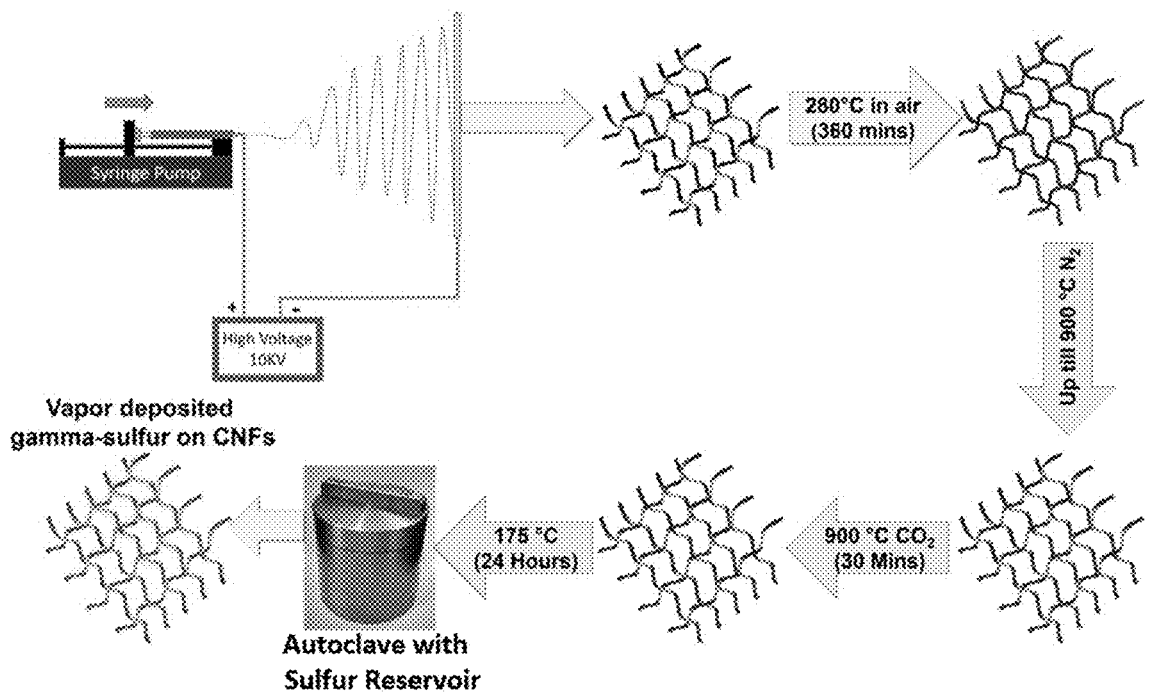
FIG. 1 shows a schematic of the fabrication procedure for making carbon nanofibers (CNFs) and vapor deposition of gamma monoclinic phase sulfur on the CNFs.

FIG. 1 shows a schematic diagram for the vapor deposition of gamma monoclinic phase sulfur on carbon nanofibers (CNFs). The CNFs are fabricated using standard methods. The CNFs are then hole punched (diameter 11 mm) and placed in the vapor deposition assembly.

Figure 2:
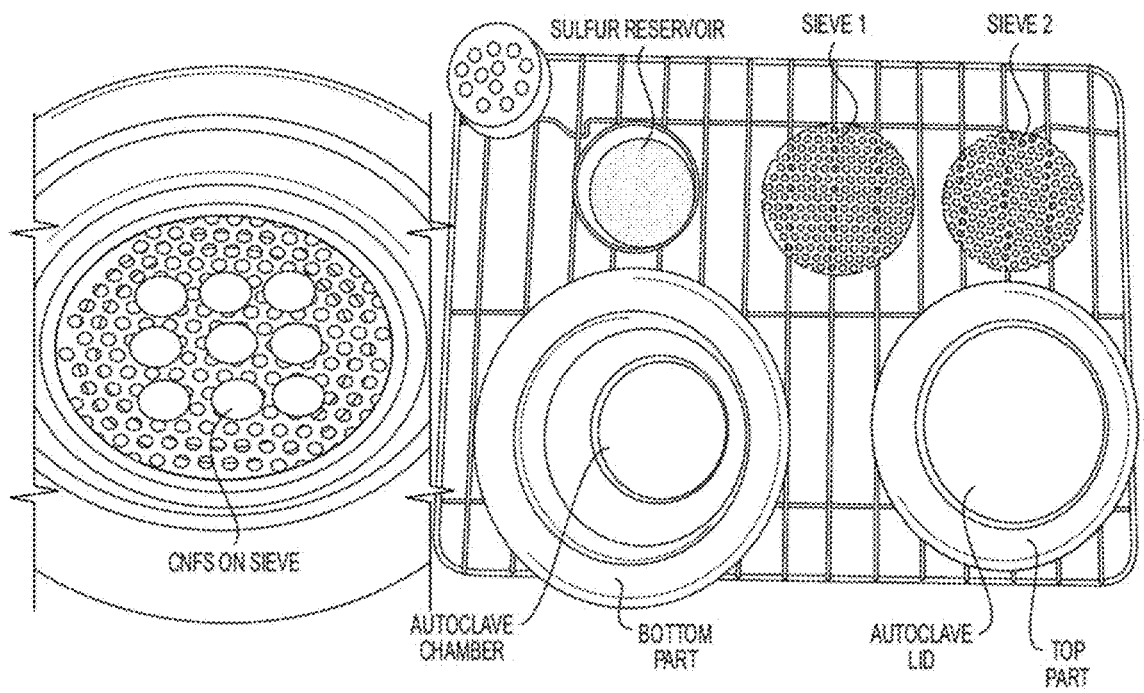
FIG. 2 shows a vapor deposition assembly and its respective parts suitable for use in the method of the present invention.
Figure 3A:
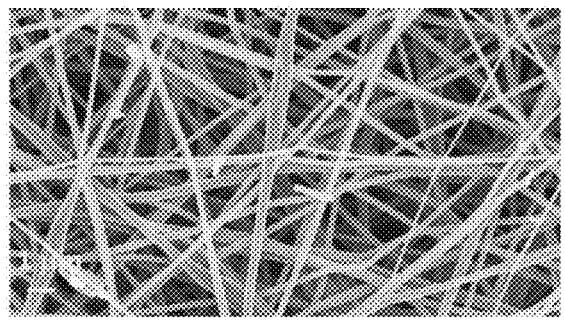
FIGS. 3A-3D show scanning electron microscope (SEM) images of the vapor deposited gamma sulfur phase on CNFs
Figure 3B:
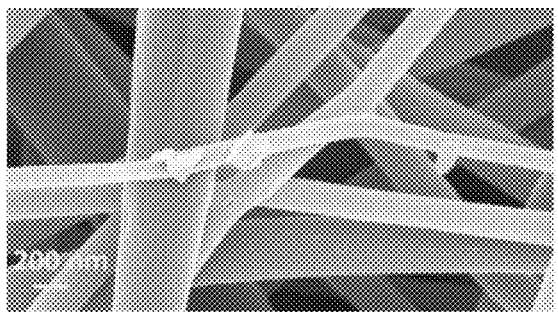
Figure 3C:
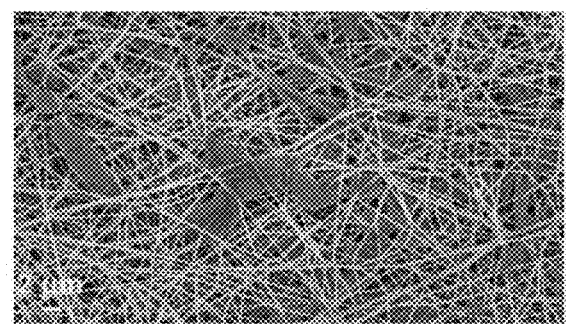
Figure 3D:
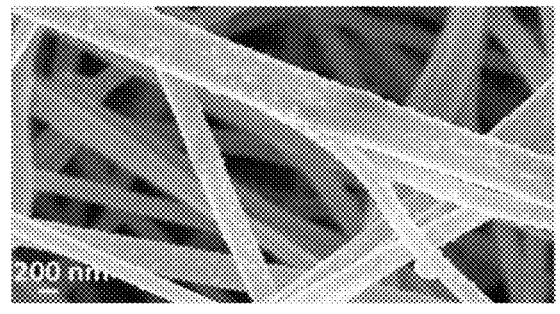

The vapor deposition assembly consists of a stainless steel autoclave as shown in FIG. 2. Other materials commonly used for autoclaves may be employed as well, for example, aluminum autoclaves. Typically, the autoclave consists of a top part or autoclave lid and bottom part that defines an autoclave chamber. The top part forms a lid that covers the chamber of the bottom part. The chamber of the bottom part consists of a sulfur reservoir zone and sieve zone. The sulfur reservoir zone of this particular apparatus is loaded with about 10.8-11 grams of sulfur (Sigma-Aldrich) in an aluminum boat. The sieve is then placed such that bubbles of hot melted sulfur do not contact the eight to ten cathodes that are placed on the sieve, i.e. a distance of about 5 cm is maintained between the topmost part of a 20 mL aluminum crinkle dish from VWR, and the sieve. An O-ring is used to seal the autoclave to prevent escape of sulfur vapor. After heating the autoclave for 25 hours in an oven at a specified temperature of, for example, 175° C., the autoclave was cooled to ambient temperature of about 18-25° C. in an ambient air environment. It is believed that sudden removal of the autoclave from 175° C. to ambient atmosphere results in a high-temperature gradient that facilitates the formation of gamma monoclinic phase.

Material Characterization

SEM images show a conformal coating of the gamma monoclinic phase sulfur on the carbon nanofibers, in addition to large chunks of the gamma monoclinic phase sulfur located in the interfiber spacing. The phase of the synthesized material was characterized using X-ray diffraction; the peaks match well with the gamma monoclinic phase sulfur, according to the Joint Committee on Powder Diffraction Standards (JCPDS) Database. The gamma monoclinic phase sulfur deposited carbon cathodes were employed in carbonate-based electrolytes (1M LiPF6 in EC: DEC (1:1 v/v)) and showed a single plateau discharge-charge behavior with an exceptional capacity of 800 mAh/g after 1000 cycles at a C/2 cycling rate with high coulombic efficiency. The current loading is 0.5-0.7 mg of gamma monoclinic phase sulfur, with 30% higher weight loadings of gamma monoclinic phase sulfur being possible. In addition, these cathodes are used without additional binders/current collectors further eliminating dead weight in the battery. Use of the gamma monoclinic phase of sulfur with a non-confinement-based approach enables the use of a solid state reaction without the need for complex and expensive confining architectures and bypasses polysulfide formation, enabling the battery to achieve a high capacity with an extended cycle life.

Figure 4A:
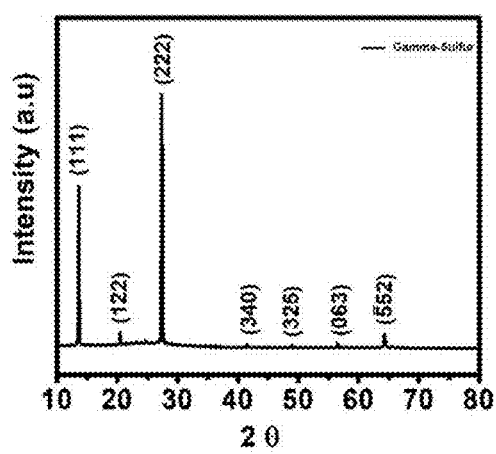
FIG. 4A shows the X-ray diffraction pattern of vapor deposited sulfur on CNFs.
Figure 4B:
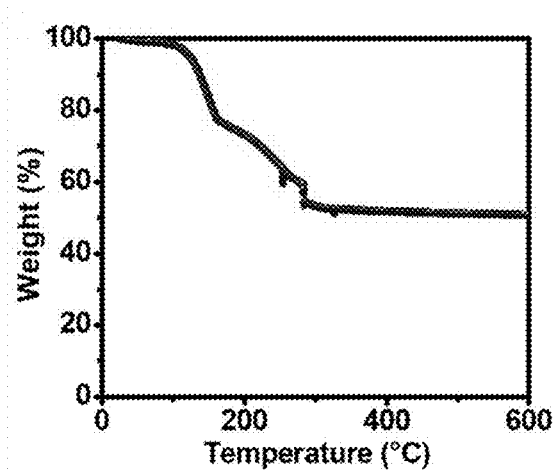
FIG. 4B shows a thermogravimetric analysis (TGA) curve of gamma monoclinic phase sulfur in a $N_2$ environment.

A morphological analysis of the vapor deposited sulfur on the CNFs was conducted using scanning electron microscopy (SEM). The SEM images (FIGS. 3A-3D) show that the sulfur is deposited conformally on the exterior surfaces of CNFs, and that blocks of sulfur are deposited in between the fibers in the inter-pore area. To analyze and quantify the material, X-ray diffraction was employed. The X-ray diffraction peaks of the vapor deposited sulfur matched the pattern of gamma monoclinic phase of sulfur (JCPDS file from the International Center for Diffraction Data) (FIG. 4A). X-ray diffraction also confirmed that the deposited sulfur was a crystalline material that allows for use of the sulfur in the Li—S battery without confinement. Weight loading of the sulfur on the CNFs was calculated by thermogravimetric analysis (TGA). Thermogravimetric analysis was carried out in nitrogen from room temperature to 600° C. at a heating rate of 10° C./min. The weight loading of the cathodes was about 50% with 0.6-0.7 mg of gamma monoclinic phase sulfur (FIG. 4B).

Electrochemical Characterization

Electrochemical characterization was carried out with gamma monoclinic phase sulfur vapor deposited on CNFs as a positive electrode, a lithium disk (diameter 13 mm) as a negative electrode, a celgard separator and a 30 microliter electrolyte (1M $LiPF_6$ in ethylene carbonate:diethylene carbonate 1:1 v/v) in a CR2032 coin cell. The positive electrode was free-standing, had about a 50% weight loading of gamma monoclinic phase sulfur and an absolute amount of gamma monoclinic phase sulfur of about 0.6-0.7 mg. To analyze the electrochemical performance, charge-discharge tests were performed at a slow C/50 rate to be able to detect evidence of side reactions.

Free-standing carbon nanofibers-based electrodes are defined as electrodes without binder and conductive additives which may be held and used independently of a metallic current collector. These are standalone electrodes since they have electron channels originating from carbon nanofibers and may not need an additional metallic sheet for mechanical stability and electrical conductivity. Depending on specific device requirements, one may need to use a current collector sheet.

Figure 5A:
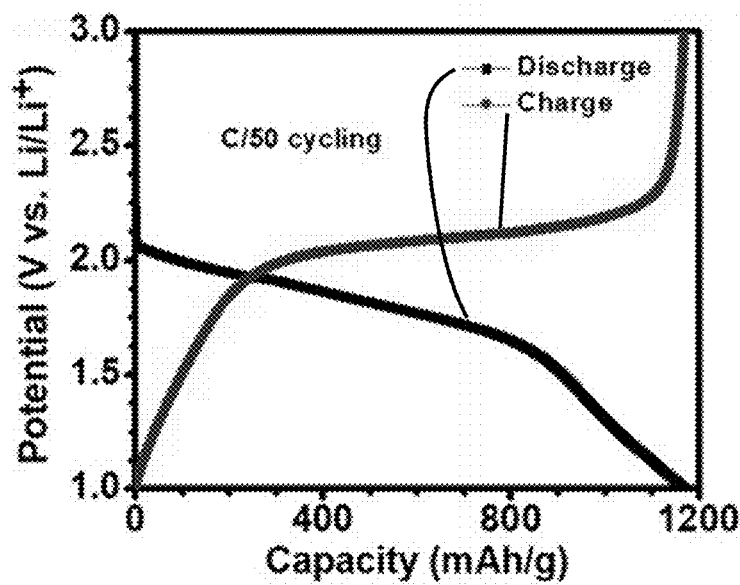
FIG. 5A shows Charge-Discharge curves at C/50 cycling of an Li—S cell.

FIG. 5A shows initial discharge and charge curves at C/50 with a capacity of about 1170 mAh/g and 1169 mAh/g. The curves also display a single plateau conversion with no evidence of side reactions.

Figure 5B:
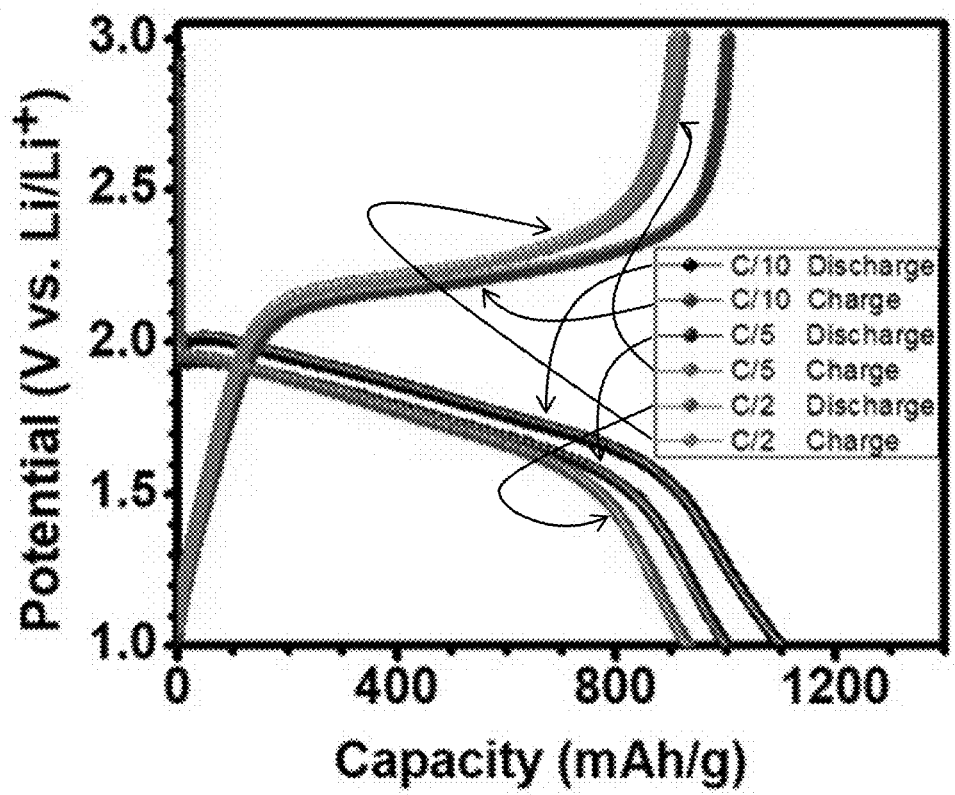
FIG. 5B shows Charge-Discharge curves at C/2, C/5 and C/10 cycling rates of the Li—S cell.

FIG. 5B shows charge-discharge curves at higher current rates, C/10, C/5 and C/2. The corresponding discharge capacities are 1100, 1000 and 920 mAh/g,m respectively. This electrode demonstrates stable operational performance, exhibiting a relatively constant capacity over 1300 cycles.

Figure 5C:
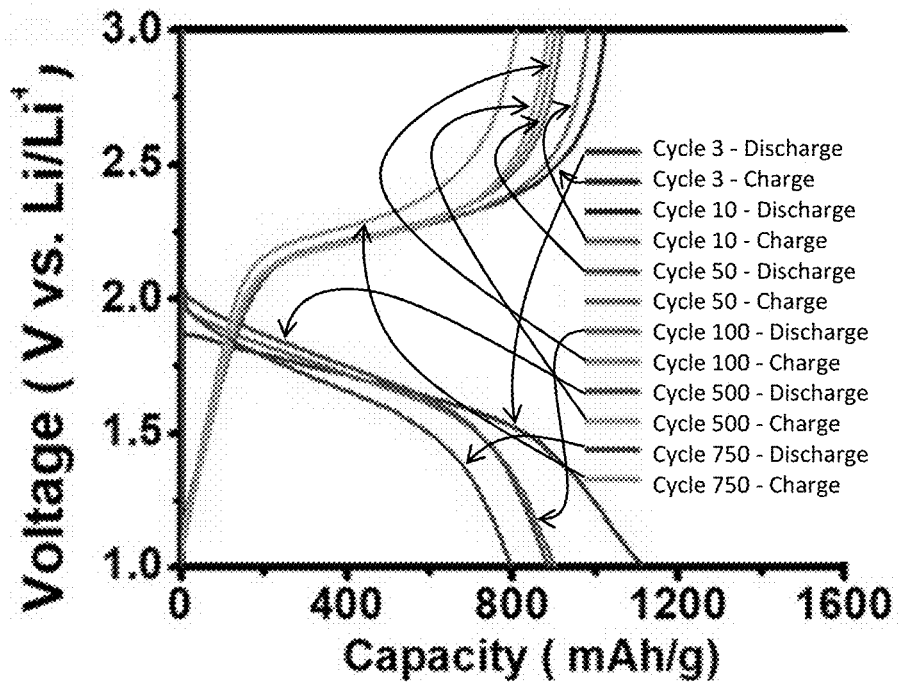
FIG. 5C shows Charge-Discharge curves at C/2 at various numbers of cycles of the Li—S cell.

FIG. 5C shows stable charge-discharge curves at a current rate of C/2 for various numbers of cycles.

Figure 5D:
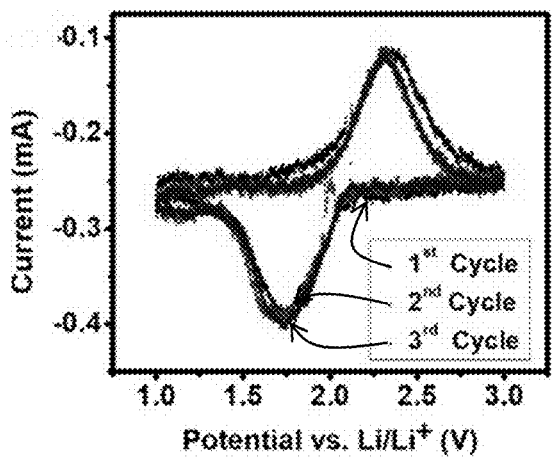
FIG. 5D shows cyclic voltammetry curves for the first, second and third cycles at 0.05 mV/s of the Li—S cell.

The cyclic voltammogram of FIG. 5D, conducted at a scan rate of 0.05 mV/s, shows a single stable plateau during both the oxidation and reduction cycles corresponding to the charge-discharge curves.

Figure 5E:
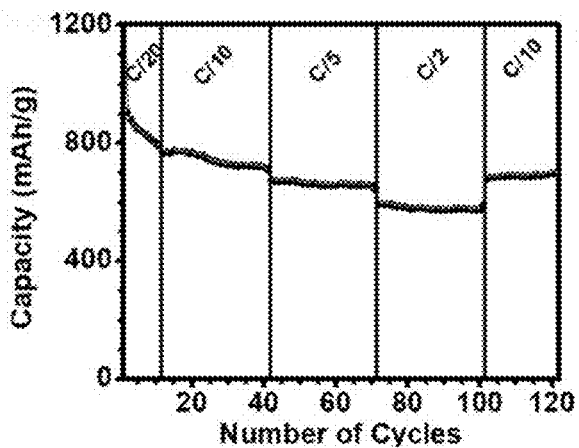
FIG. 5E shows the rate capability of the Li—S cell.
Figure 5F:
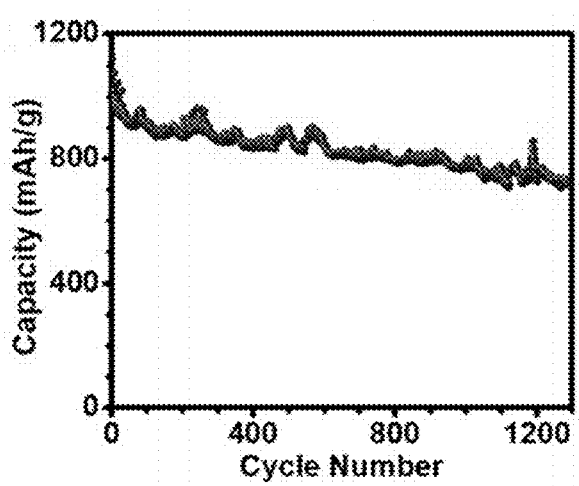
FIG. 5F shows C/2 cycling of an Li—S cell with vapor deposited gamma monoclinic phase sulfur on CNFs.
Figure 6A:
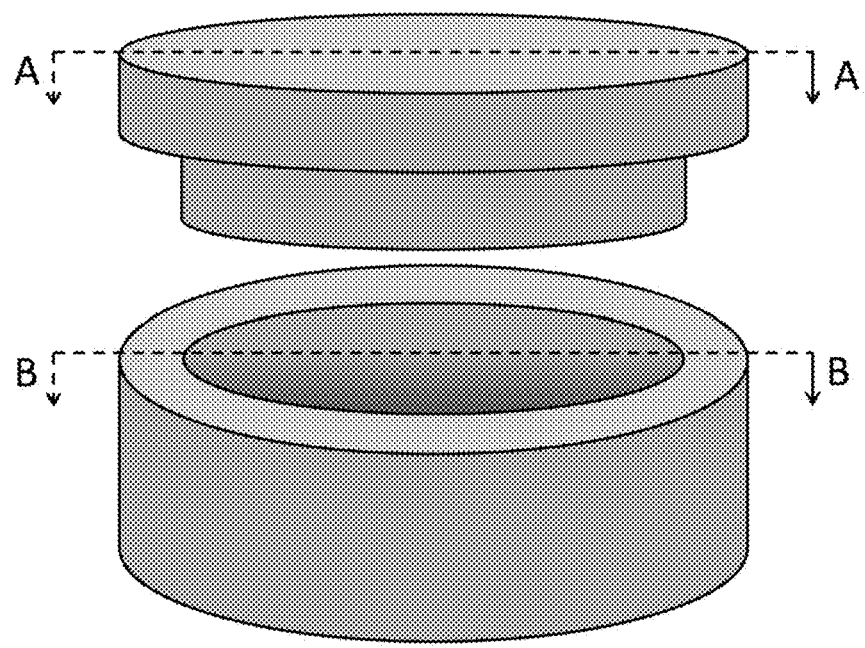
FIGS. 6A-6C show diagrams of the vapor deposition assembly.
Figure 6B:
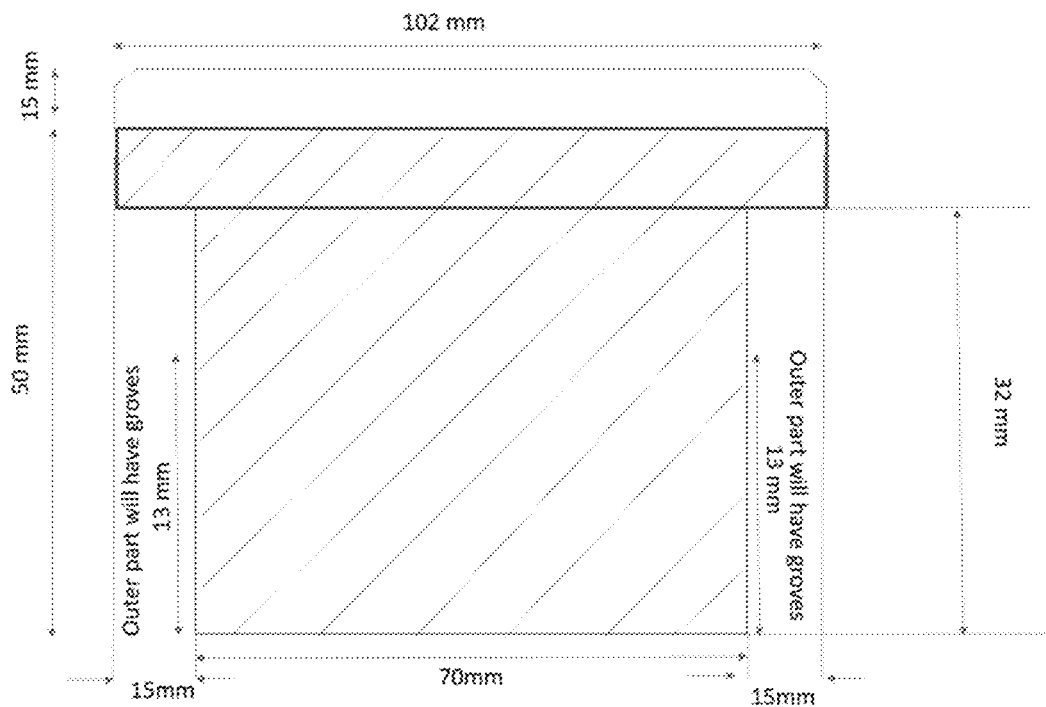
Figure 6C:
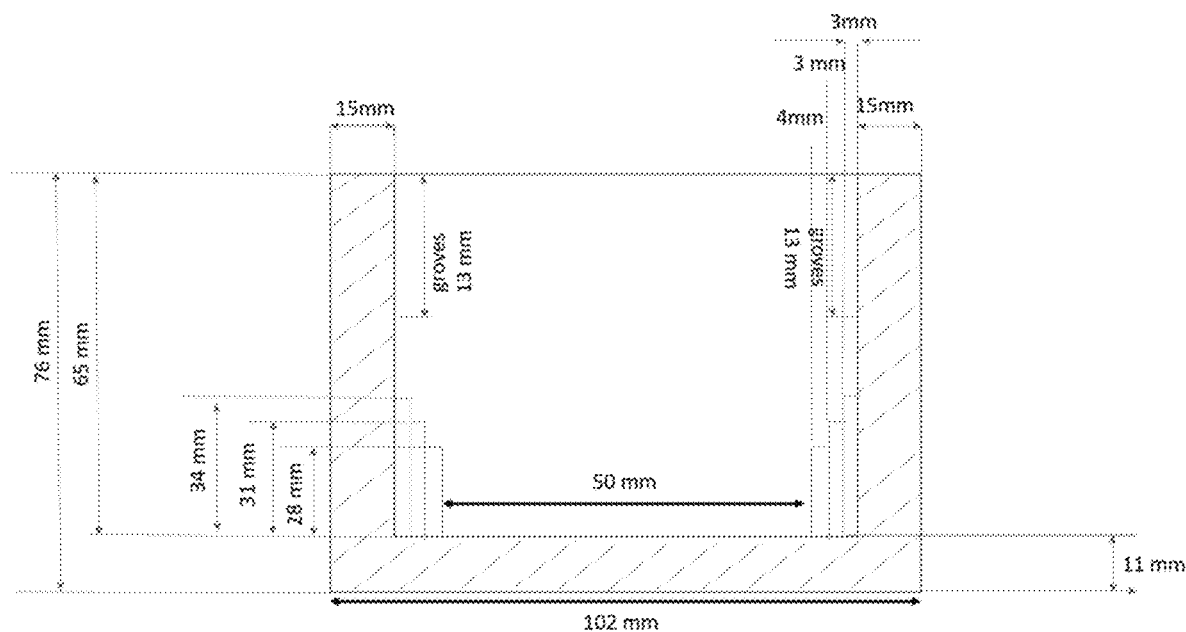

FIG. 5E displays the rate performance of gamma monoclinic phase sulfur vapor deposited on the CNFs to form a cathode. The cathode retained capacities of about 800 mAh/g at a rate of C/20, 700 mAh/g at a rate of C/10, 750 mAh/g at a rate of C/5 and 600 mAh/g at a rate of C/2 for 30 cycles each. Further decreasing the current density to C/10, a capacity of 700 mAh/g could be achieved, demonstrating the exceptional rate capability of the electrode.

The Li—S battery demonstrated ultra-stable and long-life cycling performance for 1300 cycles at a current rate of C/2 with a capacity of about 700 mAh/g. This remarkable stability can be attributed to the solid to solid conversion of gamma monoclinic phase sulfur to $Li_2S$, thereby eliminating formation of polysulfides. The excellent performance of these gamma monoclinic phase sulfur electrodes demonstrates the feasibility of high-energy carbonate-based Li—S cells for practical application.

It is considered that Li—S batteries, as well as other sulfur batteries, can be made with gamma monoclinic phase sulfur loadings on carbon nanofibers of from 3-6 $mg/cm^2$, or from 4-5 $mg/cm^2$.

Free-standing carbon nanofiber/S cathodes were also tested for long-term cycling in room temperature Na—S batteries. The as-prepared CNF/S (~1.08 $mg/cm^2$, 43.8 wt % S) cathodes were used directly as cathodes in 2032 type coin-sized room temperature Na—S cells. The electrochemical tests were performed in an ethylene carbonate/propylene carbonate/fluoroethylene carbonate-based electrolyte against an Na/Na+ anode. The cyclic voltammetry and charge discharge results showed a single potential for conversion of sulfur to $Na_2S$. The CNF/S cathodes delivered a capacity of about 1229 mAh/g during the first cycle with about a 51.1% coulombic efficiency. The capacity of the room temperature Na—S cells was stabilized at about 350 mAh/g after the first cycle and was sustained for up to 300 cycles with only about a 0.03% decay rate per cycle. The postmortem x-ray diffraction results confirmed the conversion of sulfur to $Na_2S$ and vice versa. Further, in situ electrochemical impedance spectroscopy, postmortem x-ray photonelectric spectroscopy (XPS) and galvanostatic intermittent titration technique (GITT) tests were carried out to investigate the underlying conversion mechanism. The preliminary results showed that the observed single plateau and long-term cycling of room temperature Na—S cells was the convoluted effect of deposited sulfur and a stable SEI layer on the cathode side.

EXAMPLES

The following examples are illustrative, but not limiting of the methods and compositions of the present disclosure.

The following materials were employed throughout the examples, Polyacrylonitrile (PAN, Mw 150 000 g/mol), N,N-Dimethylformamide (DMF, purity 99.8%), Sulfur (S, purity 99.998% trace metals basis), Ethylene carbonate (EC, purity≥99%, acid<10 ppm, H2O<10 ppm), Diethyl carbonate (DEC, purity≥99%, acid<10 ppm, H2O<10 ppm) and Lithium hexafluorophosphate (LiPF6, Purity≥99.99% trace metals basis, battery grade) were obtained from Sigma Aldrich. All chemicals were used without further processing.

Synthesis of Carbon Nanofibers (CNFs):

The free-standing carbon nanofibers were made by electrospinning Typically, 10 wt % Polyacrylonitrile, PAN (Mol wt. 150,000, Sigma Aldrich) was added to N, N-Dimethylformamide and stirred overnight to form a polymeric blend. This blend was then loaded into a Becton Dickinson 5 mL syringe with a Luer lock tip and an 18-gauge stainless steel needle (Hamilton Corporation). The syringe with the needle was connected to an NE-400 model syringe pump (New Era Pump Systems, Inc.) in order to control the feeding rate of the solution. The grounded aluminum collector was placed 6 inches from the tip of the needle. Electrospinning was performed at room temperature with relative humidity below 15%. A potential difference of 7-8 KV (Series ES (30 KV), Gamma High Voltage Research, Inc.) was applied between the collector and the tip of the needle. The flow rate of the solution was kept constant at 0.2 mL/hr. The as-spun nanofibers were collected and stabilized in a convection oven at 280° C. for 6 hours in the air. Finally, these stabilized nanofiber mats were activated by carbonizing in nitrogen up till 900° C. and dwelled for 1 hour with $CO_2$ flow in a horizontal tube furnace. A heating ramp rate of 2° C./min was employed for both the stabilization and carbonization process.

Monoclinic Gamma Phase Sulfur Deposition on Carbon Nanofibers (CNFs):

The free-standing CNFs mat was punched with stainless steel die ($\phi$=11 mm) and weighed. The CNFs discs were then placed in a house-made autoclave (Stainless steel 316) and subjected to 180° C. for 24 hours in an oven. The autoclave included a sulfur reservoir at the bottom and perforated disk for placing electrodes at the top. A gap of 1.5 cm between the surface of reservoir and the cathodes was used. The distance between the reservoir and the electrodes was found to play a key role in the appropriate loading and deposition of sulfur. After 24 hours the autoclave was cooled to room temperature slowly in a span of 6-8 hours. The heat treatment results in the formation of pungent odors and hence the autoclave was opened in the fume hood and the electrodes were taken out. The electrodes were weighed and transferred in Argon filled glove box via overnight vacuum drying in the antechamber, for battery fabrication.

Characterization

Material

Morphological and elemental characterizations of the nanofibers were done using a scanning electron microscope (SEM) (Zeiss Supra 50VP, Germany) equipped with energy-dispersive X-ray spectroscopy (EDS) with an in-lens detector and 30 μm aperture was used to examine the morphology and obtain micrographs of the samples. X-ray diffraction (XRD) patterns were acquired on a diffractometer (Rigaku Smartlab, Tokyo, Japan) using Cu $K_\alpha$ radiation (40 kV and 44 mA) with a step size of 0.02° in the 2θ range of 10-70°. The surface chemistry of the samples was analyzed by using XPS spectra (Physical Electronics Versa Probe 5000 spectrometer with monochromatic Al Kα as an excitation source), with a spot size of 200 μm and pass energy of 23.5 eV were used to irradiate the sample surface. A step size of 0.5 eV was used to gather the high-resolution spectra. CasaXPS Version 2.3.19PR1.0 software was used for spectra analysis. The XPS spectra were calibrated by setting the valence edge to zero, which was calculated by fitting the valence edge with a step-down function and setting the intersection to 0 eV. The background was determined using the Shirley algorithm which is a built-in function in the CasaXPS software. Thermogravimetric analysis (TGA) data of all of the samples were collected on a TA Instruments 2950 (TA Instruments, New Castle, Del.) under a steady argon flow at a heating ramp rate of 5° C. min-1. Nitrogen adsorption-desorption analysis of the freestanding nanofiber mats was performed at 77 K on an automated gas sorption analyzer (AutoSorb iQ2, Quantachrome Instruments). The sample was degassed overnight at 150° C. under $N_2$ flow prior to this analysis.

Electrochemical

Electrochemical measurements were carried out by preparing 2032-type coin cells (MTI and Xiamen TMAX battery equipment) assembled in an argon-filled glove box (MBraun Labstar pro, MB 10G, H2O and O2<1 ppm). As transferred electrodes were used as working electrodes and 13 mm lithium discs punched from Lithium foil (Alfa Aesar, 75 mm thick) were used as counter/reference electrodes. To improve the mass loading, cathodes were stacked on to each other. A typical weight loading of around 45-50% was used with a mass loading of around 0.5-5 $mg/cm^2$ for electrochemical testing. The ether electrolyte was prepared by dissolving 1.8 M lithium trifluoromethanesulfonate in a solvent mixture of 1,2-dioxolane (99.8%, anhydrous, stabilized with 75 ppm BHT, AcroSeal) and 1,2-dimethoxyethane (Extra Dry≥99%, AcroSeal) in 1:1 volume ratio. The carbonate electrolyte consisted of 1 M LiPF6 in 1:1 volume ratio of Ethylene carbonate and Diethyl carbonate (purity≥99%, acid<10 ppm, H2O<10 ppm). Polypropylene membrane (25 μm, Celgard Inc) was used as a separator. The galvanostatic charge-discharge measurements were carried out in a potential range of 1.0-3.0 V vs Li/Li' using a battery cycler (Maccor 4000 and Neware BTS 4000). The CV measurements were performed in a potential range of 1.0-3.0 V vs. Li/Li+ at a range of scan rates from 0.01-0.5 mV/s using a multi-channel battery tester (Biologic VMP3). Electrochemical impedance spectroscopy (EIS) measurements were performed between 100 mHz to 100 MHz frequency range using an AC perturbation of 10 mV rms amplitude (Biologic VMP3).

Results and Discussion

Material Characterization

Figure 7:
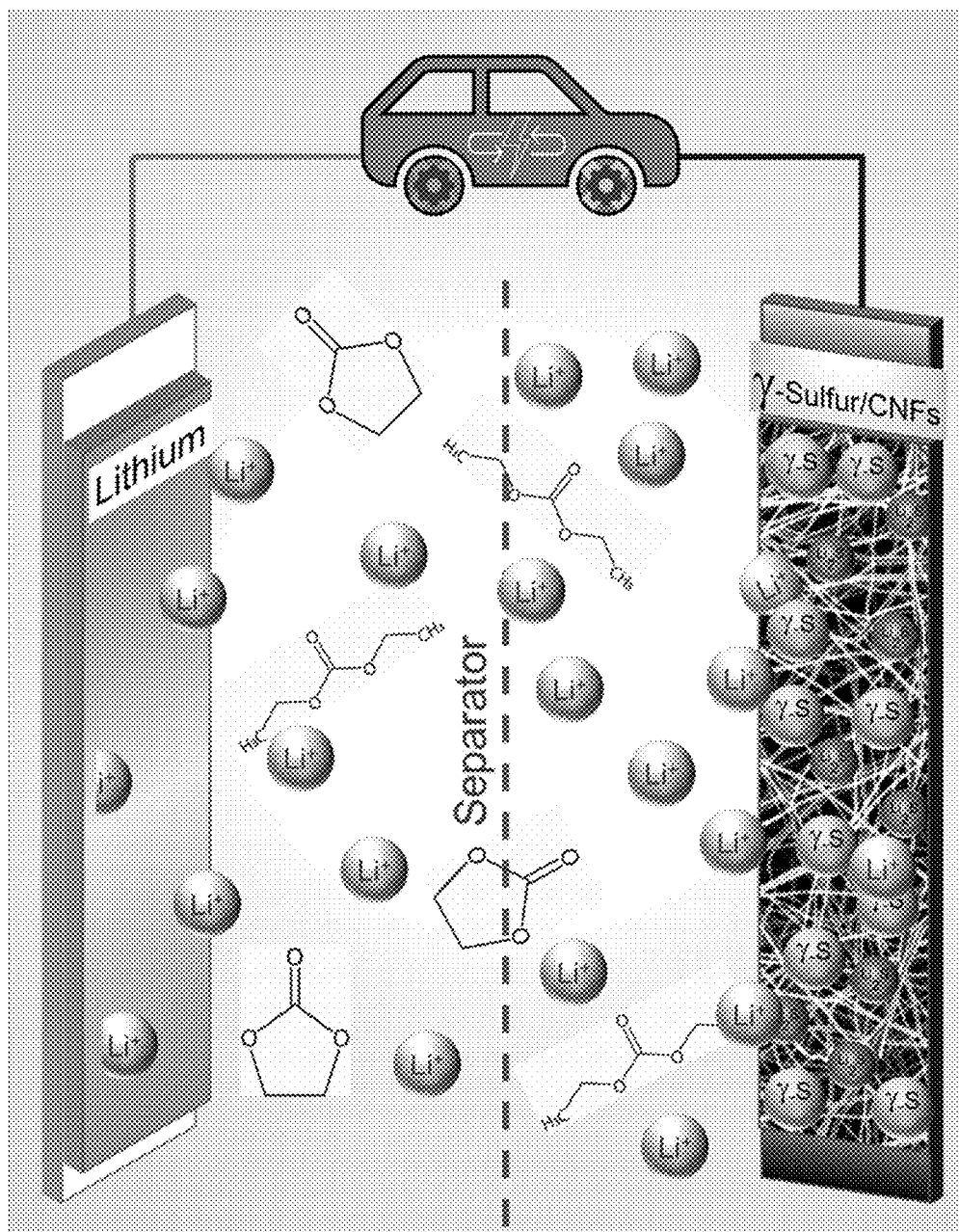
FIG. 7 is a schematic of a lithium-sulfur battery discharge in the carbonate-based electrolyte. At least some of the gamma-monoclinic sulfur is deposited on the external surface of the carbon nanofibers. The medium sized balls signify surface deposited gamma-monoclinic sulfur, and the small balls signify lithium sulfide, the product formed after reduction of sulfur.
Figure 8A:
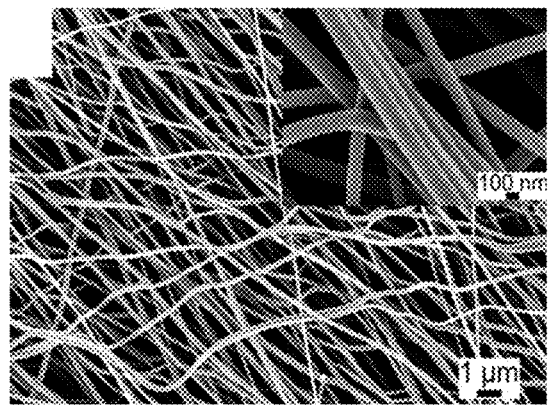
FIGS. 8A-8F show the material characterization of CNFs and γ-sulfur deposited CNFs.
Figure 8B:
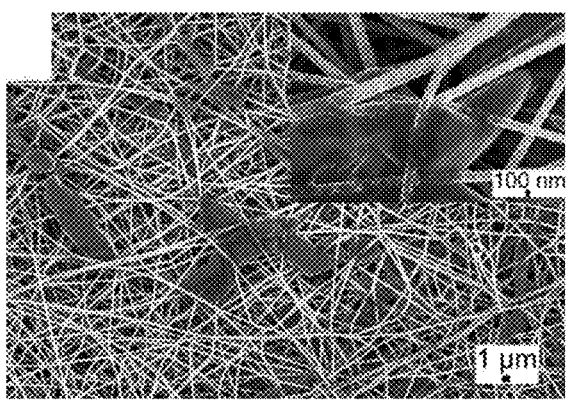
Figure 8C:
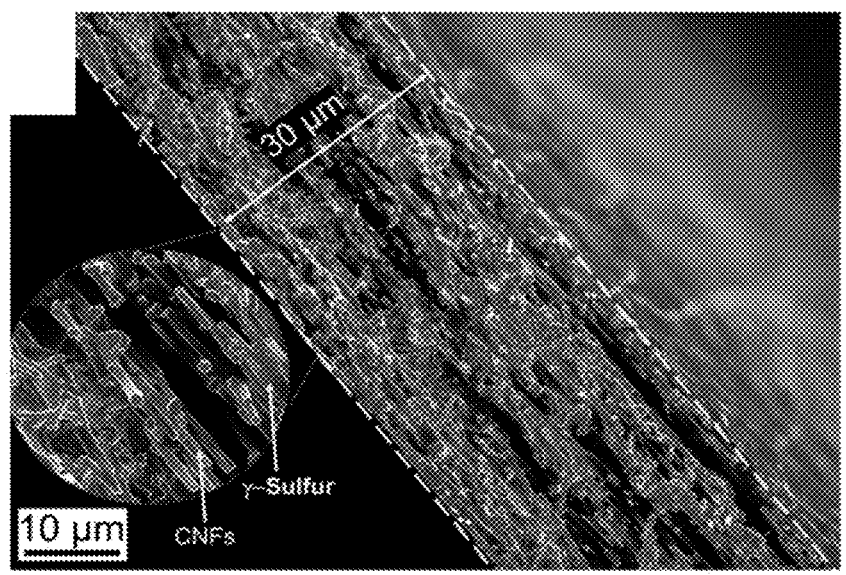

FIG. 7 provides a schematic outline of a Li—S cell with a gamma monoclinic phase sulfur based cathode in carbonate electrolyte. Briefly, activated carbon nanofibers (CNFs) were prepared by electrospinning 10 wt % polyacrylonitrile (PAN) in DMF. The as-spun mats were then subjected to air stabilization followed by carbonization in an inert environment and $CO_2$ treatment for 1 hour to form free-standing carbon nanofibers. The scanning electron microscopy (SEM) images in FIG. 8A show a smooth carbon nanofiber surface with an average diameter of ~150 nm. After sulfur deposition in the autoclave, SEM images reveal a consistently rough fiber morphology suggesting uniform and conformal coating of sulfur (FIG. 8B). Few regions display blocks of sulfur deposited within the inter-fiber spacing. Overall these images provide clear evidence that the sulfur is largely on the outer carbon nanofiber surface.

Figure 8D:
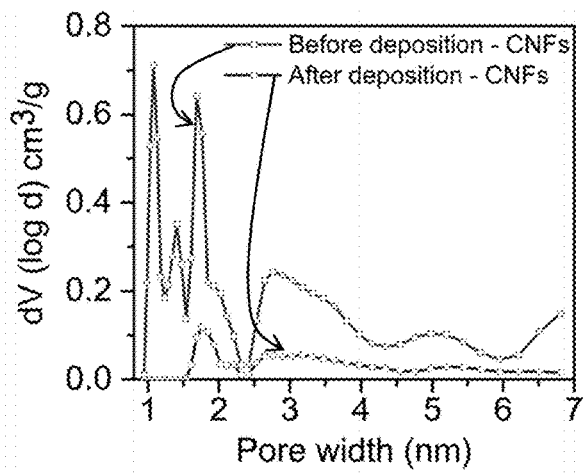
Figure 8E:
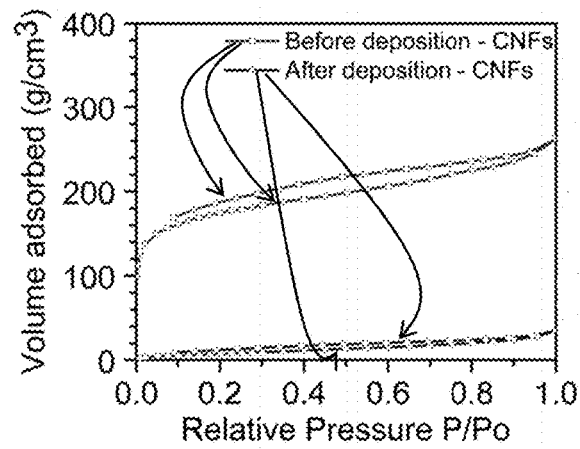
Figure 8F:
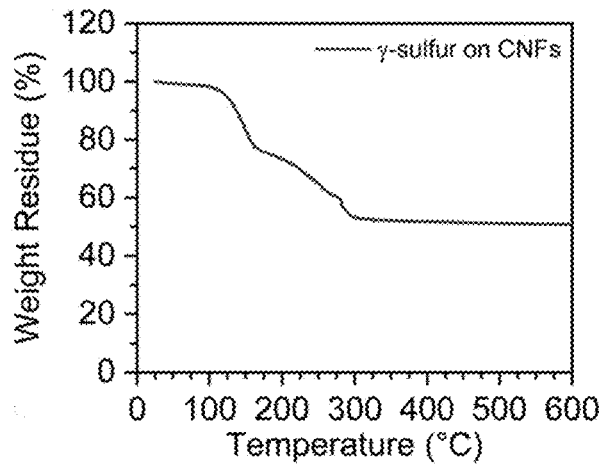

To further understand the effect of sulfur deposition on surface area and pore sizes of CNFs, Brunauer-Emmett-Teller (BET) surface area analysis was conducted. FIGS. 8D-8E show the $N_2$ absorption/desorption isotherm plots and pore size distribution of CNFs before and after sulfur deposition. For CNFs, the gas uptake increases to a high value at a low relative pressure ($P/P_0<0.05$), and the adsorption isotherm exhibits a plateau at middle and high relative pressures. The hysteresis loop at P/P0=0.2-1.0 represents mesoporosity. The adsorption isotherm is a combination of IUPAC types I & IV isotherms which confirms the presence of both micro and mesopores on CNFs[21]. However, after the sulfur deposition in the autoclave, we observe the change of the isotherm suggesting a decrease in surface pores with significantly lower gas uptake. Pore size distribution in FIG. 8E denotes CNFs portray a multi-modal pore structure in the nanoscale regime with an average pore size of 2.916 nm and a pore volume of 0.409 $cm^3/g$. After the sulfur deposition, the CNFs display an enormous reduction in pore volume (0.054 $cm^3/g$) suggesting pore filling by sulfur. Pore structural parameters of all the materials are summarized in Table 1. The BET and SEM data suggest that sulfur is partially confined within the carbon nanopores. Nevertheless, there is clear evidence of exposed unconfined sulfur on the external carbon surface which differentiates the structure of the present invention from prior art structures where the deposited sulfur is confined within the pores of the material. For example, at least 2 wt %, or at least 5 wt % or at least 10 wt % or at least 20 wt % of the sulfur is deposited on the surface. FIG. 8F shows the thermogravimetric analysis on sulfur-deposited CNFs conducted in inert nitrogen atmosphere with a heating rate of 10° C./min from room temperature to 600° C. The TGA curve shows mild initial weight loss below 100° C. associated with evaporation of adsorbed moisture. A continuous weight loss beyond this point was observed over a wide temperature window until 300° C. with two distinct degradation rates. The melting of sulfur occurs at 119° C. and sulfur starts to evaporate soon after due to its high vapor pressure. The wide decomposition temperature range and multiple degradation rates observed in TGA further corroborate partial pore-confinement of sulfur. While the higher-rate lower-temperature weight loss suggests evaporation of exposed unconfined sulfur, the lower-rate higher-temperature loss can be attributed to sulfur confined in micro/mesopores. The sulfur content in the CNFs/S composite determined by TGA was 50 wt %.

TABLE 1

| Sample | $S_{BET}$ ($m^2/g$) | $V_t$ ($cm^3/g$) | $V_{mic}$ ($cm^3/g$) | Average pore diameter (nm) |
| --- | --- | --- | --- | --- |
| CNFs before thermal treatment | 558.4 | 0.2712 | 0.215 | 2.916 |
| CNFs after thermal treatment | 31.78 | 0.02603 | 0.00542 | 6.821 |

Figure 9A:
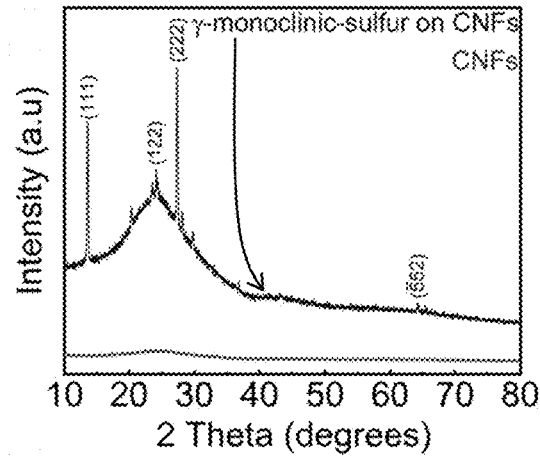
FIGS. 9A-9F show the phase and surface characterization of CNFs and gamma sulfur deposited CNFs.

FIG. 9A shows the room temperature XRD patterns of bare CNFs and after sulfur deposition. The bare CNFs display no significant diffraction peaks. A wide hump is seen from 2 theta of 20-30 degrees due to the amorphous nature of carbon in CNFs. However, after the sulfur deposition, we see a rare and metastable phase of sulfur—the monoclinic gamma phase (Rosykite). This is striking behavior since only orthorhombic-alpha (S8), rhombohedral (S6), hexagonal (S8) and polymeric allotropes of sulfur are known to be stable at room temperature[24]. Nevertheless, repeatable XRD signatures after sulfur deposition treatment show the presence of gamma-monoclinic sulfur in the samples. It is established in the literature that the monoclinic phases (largely α and β) are stable only at temperatures>95° C.[22,23] and below this temperature the monoclinic phase quickly converts back to the stable orthorhombic form. Only a handful of reports in the past two centuries have even mentioned the presence of gamma-monoclinic sulfur at room temperature for short periods[25-27].

However, the present gamma-monoclinic phase has been shown to be stable for at least 395 days at room temperature and it remains stable, showing no signs of phase change. A recent DFT study on stabilization of metastable sulfur shows that the carbon host can facilitate the stabilization of a monoclinic sulfur phase if the number of carbon atoms exceeds 0.3 per S8 unit crystal structure[28]. In addition, it was recently suggested by Moon et al. that carbon facilitates the formation and helps in retaining the monoclinic structure at room temperature for longer periods[25]. In our study, we hypothesize that the monoclinic gamma phase formed at elevated temperatures penetrates the porous carbon structures and retains its crystal structure even after cooling due to the local carbon density within the pores. This unique crystal structure once trapped within the pores possibly propagates throughout the sulfur blocks including those that are externally deposited in an "unconfined" state.

Figure 9B:
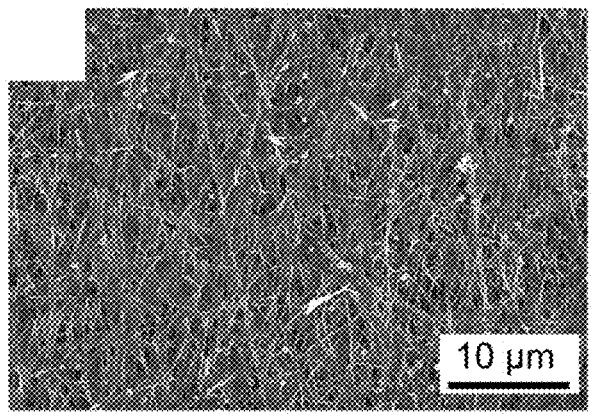
Figure 9C:
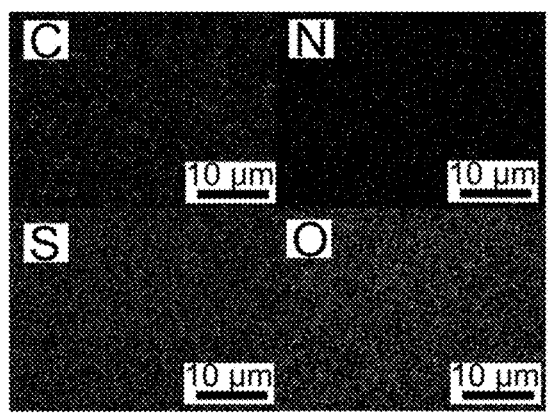
Figure 9D:
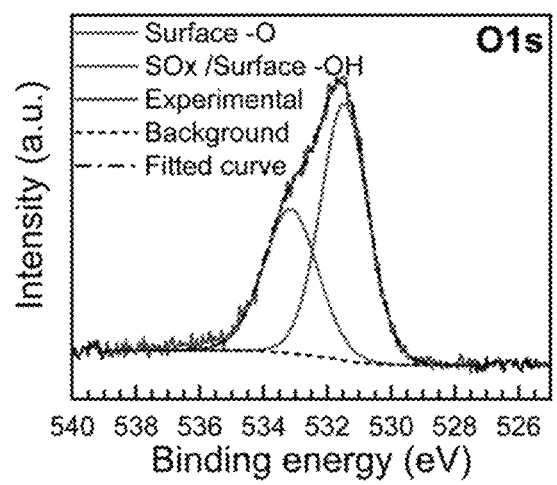
Figure 9E:
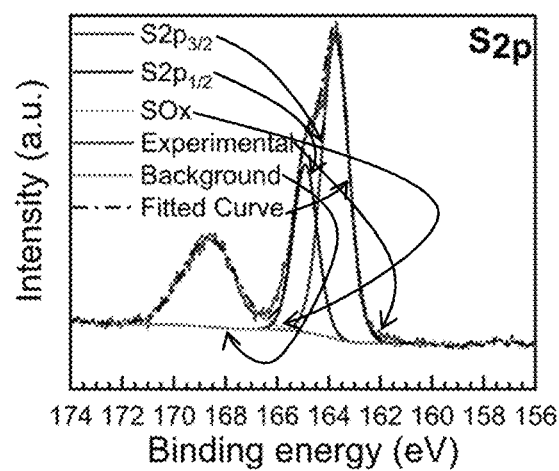
Figure 9F:
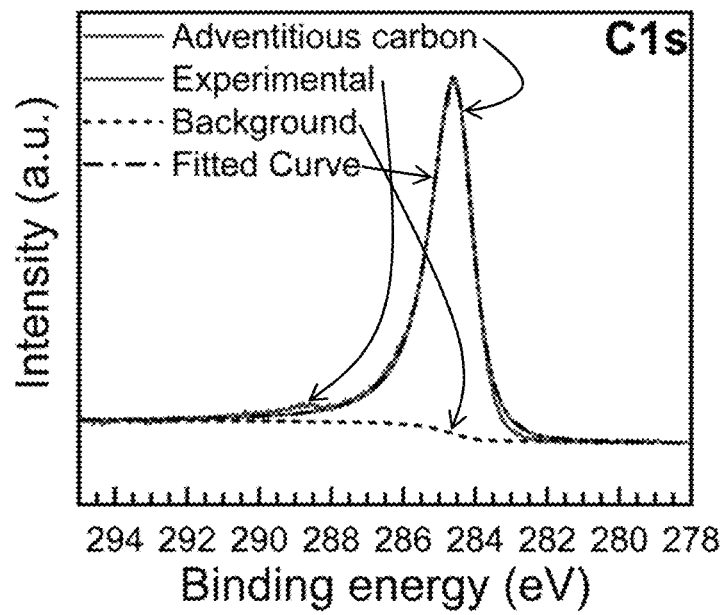
Figure 17:
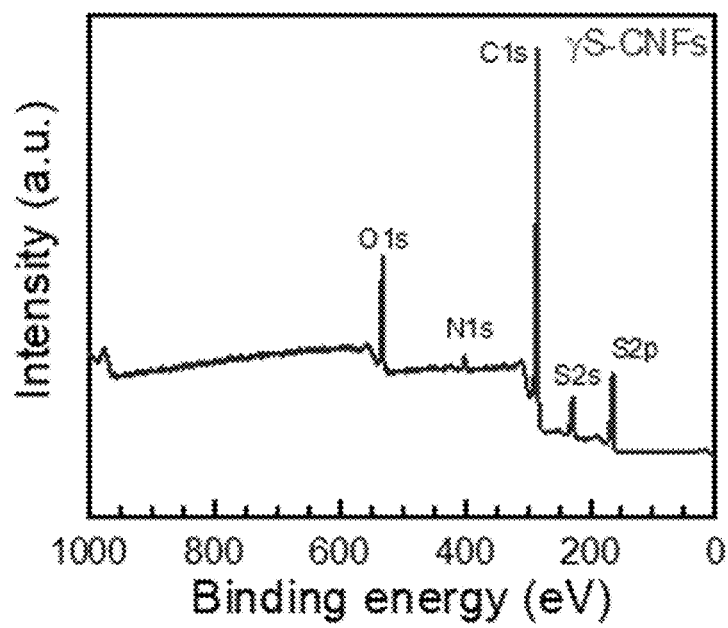
FIG. 17 shows a survey spectra of gamma sulfur deposited CNFs, which shows the existence of C1s, S2p, and O1s peaks in the composite.

FIGS. 9B and 9C show the EDX mapping and corresponding low magnification SEM image exhibiting uniform distribution of sulfur. To confirm the chemical composition and surface properties of pristine gamma-monoclinic-sulfur based CNF cathodes (gamma sulfur deposited CNFs), XPS measurements were performed and the results are displayed in FIGS. 9D-9F. The survey spectra, shown in FIG. 17, shows the existence of C1s, S2p, and O1s peaks in the composite. The peaks centered at 284.6 eV, 531.0 eV, and 533 eV correspond to the C1s, O1s and the adsorbed surface hydroxyl group (—OH), respectively[29]. FIG. 9D shows the high-resolution S2p spectra of the composite. The $S2p_{3/2}$ peak at 163.7 eV and $S2p_{1/2}$ peak at 164.9 eV with an area ratio of 1:2 and delta E of 1.18 eV are the characteristic peaks of solid sulfur in the composite[30]. Another broad peak centered at 168.8 eV can be attributed to the surface oxidation of sulfur during high-temperature sulfur deposition treatment. The smooth Lorentzian asymmetric peak of carbon further confirms that sulfur does not react with the bare carbon surface.

Electrochemical Characterization

Figure 10A:
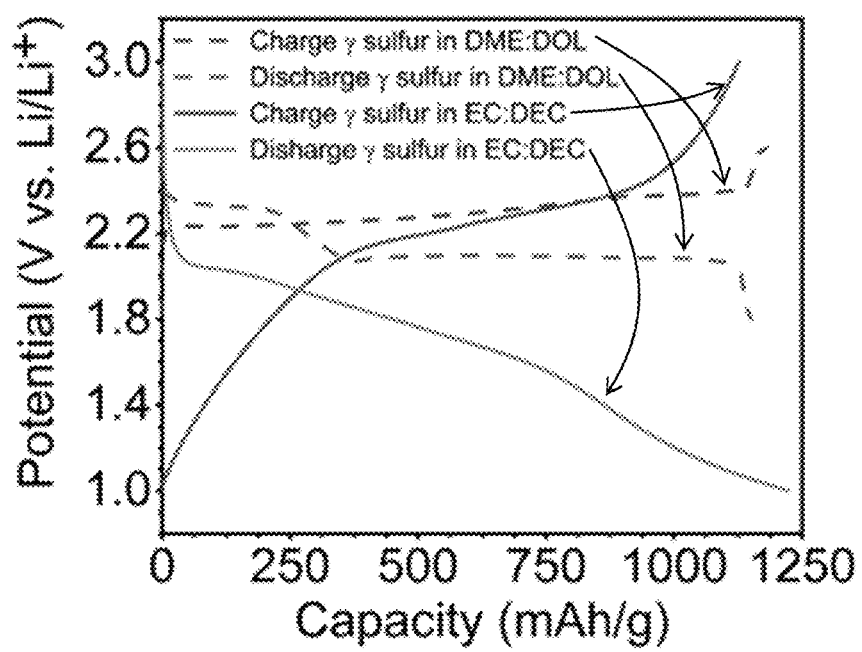
Figure 10B:
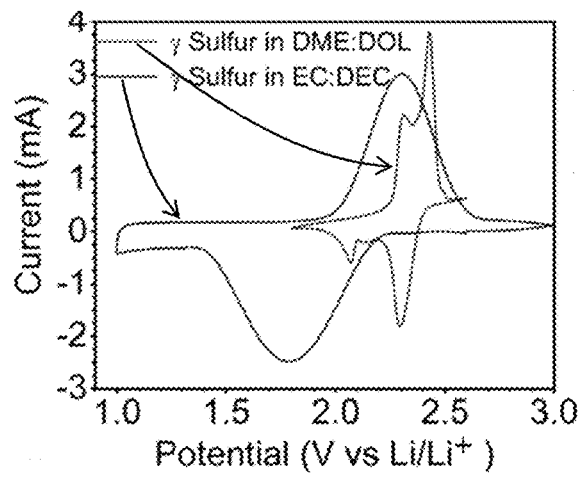

FIG. 10 shows the electrochemical performance evaluation of gamma sulfur deposited CNFs used as free-standing cathodes in CR 2032 type coin cells with reference/counter as lithium. Both ether- and carbonate-based electrolytes were employed to understand the electrochemical phenomenon in each system. The electrode demonstrates a reversible electrochemical redox behavior in both ether and carbonate-based electrolytes. However, the charge-discharge profiles are drastically different. (FIG. 4a). The ether-based charge-discharge profile exhibits a standard two-plateau behavior as reported in most prior literature reports. The first plateau at 2.3 V is attributed to the conversion of sulfur to long-chain polysulfides and the second plateau at 2.1 V represents the conversion of long-chain polysulfides to $Li_2S_2$ and $Li_2S$ (2.1 V). However, the same gamma sulfur deposited CNF cathodes in carbonate electrolytes demonstrate a single plateau at 2.0 V in the first and all consecutive cycles during discharge and 2.2 V in charge profiles suggesting the possibility of a polysulfide digression route to directly form lithium sulfide in carbonate electrolyte. This solid-to-solid conversion possibly also leads to a higher overpotential explaining the lower plateau voltage observed in the carbonate electrolyte. The electrochemical behavior is consistent with CV profiles, wherein the cells with ether electrolyte show two peaks, while the cells with carbonate electrolyte only show a single peak.

Figure 10C:
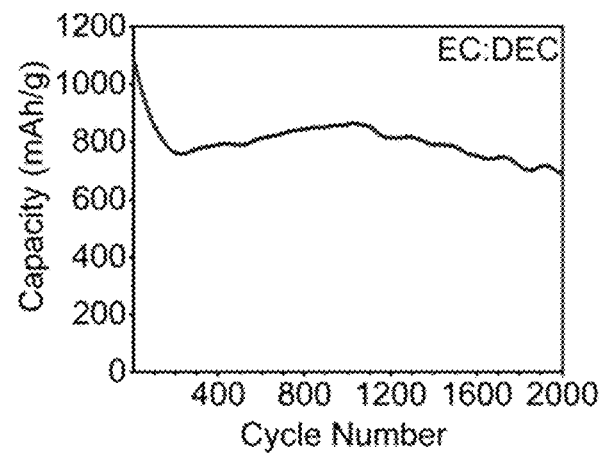
Figure 18A:
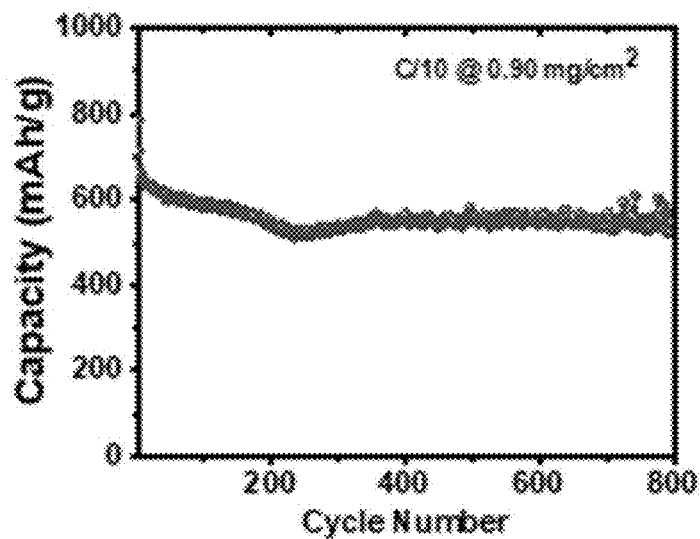
FIG. 18A shows the cycling stability of a carbonate electrolyte at 0.1 C rate.
Figure 18B:
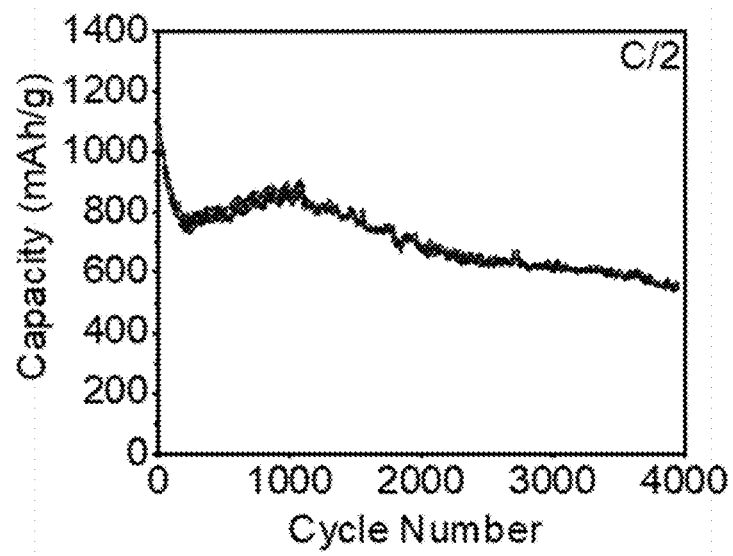
FIG. 18B shows the cycling stability of a carbonate electrolyte at 0.5 C rate.

FIG. 10C shows the long-term cycling performance tested under various galvanostatic modes. The discharge capacities were calculated at both low and high current rates of 0.1 C and 0.5 C and the capacities retained after 1000 cycles were 500 mAh/g and 770 mAh/g, respectively. The results for the discharge capacities at both low current rate (0.1 C) and high current rates (0.5 C), are shown in FIGS. 18A and 18B, respectively. FIG. 10C shows the long-term cycling data for cells made using carbonate electrolyte. These cells demonstrate ultra-stable and prolonged cycling at 0.5 C rate for 2000 cycles with only 0.113% decay after the initial 200 cycles. The cells retained a capacity of 704 mAh/g even after 2000 charge-discharge cycles. The initial drop in capacity may be attributed to the loss of contact due to volume expansion during cycling which stabilizes as the cycling proceeds. As shown in FIG. 10D, the discharge profile continues to exhibit a single plateau through the entire cycle life of 2000 cycles.

Figure 19:
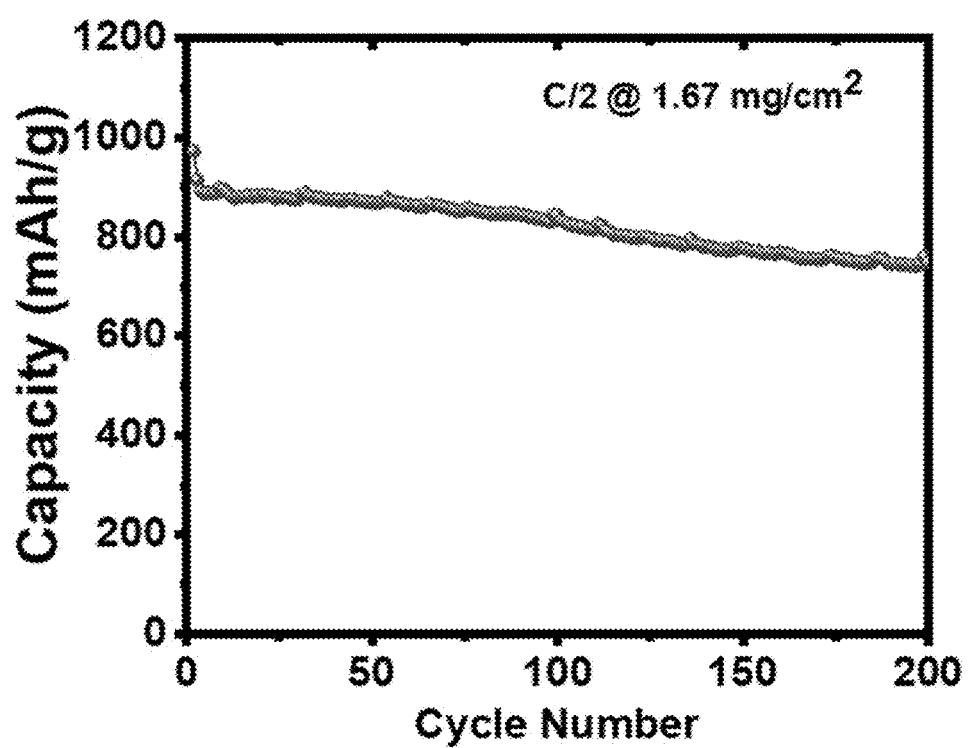
FIG. 19 shows the cycling stability of an ether electrolyte.

It has been established in a recent report by Kim et al. that polysulfides, if generated, attack carbonate species via nucleophilic substitution to form the irreversible products, thiocarbonate and ethylene glycol, and shut down further electrochemical activity after the first cycle. Therefore, our data suggests that these gamma sulfur deposited CNF-based cells continue to follow a polysulfide digression route through the entire cycling in carbonate electrolyte, which explains not only continued battery operation despite the presence of carbonate species but also the excellent cycle stability of 2000+ cycles. For comparison, the cycling data in ether electrolyte is shown wherein these materials follow a standard route with polysulfides as the intermediate products. The cycling data in ether electrolyte may be found in FIG. 19. Here we see a gradual decline in capacity due to the expected polysulfide shuttling and subsequent loss of active material.

To further corroborate this unique electrochemical behavior of gamma monoclinic phase sulfur in carbonate electrolyte and infer information about the reaction mechanism, differential capacity (dQ/dV) analysis and EIS as a function of voltage were conducted. A consistent single peak is seen throughout the 2000 cycles further supporting a single-phase conversion. The peaks minimally shift during the cycling suggesting good material integrity and only a minimal increase in resistance during cycling. As a next step, the electrochemical impedance spectroscopy (EIS) measurements of the lithium half-cells with gamma sulfur deposited CNFs as composite cathodes were carried out at various potentials during charge-discharge cycles. FIG. 10F presents the typical Nyquist plots for the Li—S batteries of the invention illustrating their impedance trends as a function of voltage. As seen in this figure, a typical Nyquist plot consists of a semicircle in the high frequency to medium frequency range, which is attributed to the interfacial charge transfer resistance. The charge transfer resistance (Rct) monotonically decreases as the cathodic curve progresses towards a lower potential for the entire discharge cycle. The trend is reversed when the battery is charged back to a higher potential. This observation contrasts with the literature, wherein the $R_{ct}$ is shown to first decrease and then increase back again in the same discharge cycle suggesting the formation of soluble polysulfides at intermediate voltages. These intermediate polysulfides significantly lower the $R_{ct}$ due to disappearance of both of the solid insulating materials—the initial reactant, sulfur and final product, $Li_2S$. In the literature, the $R_{ct}$ of the final discharged cell still remains lower than the initial $R_{ct}$ (at OCV) due to reduced resistance of $Li_2S$ compared to pure sulfur. A monotonic decrease in $R_{ct}$ during discharge in the present experiments provides further evidence that we are eliminating the formation of polysulfides.

Figure 11C:
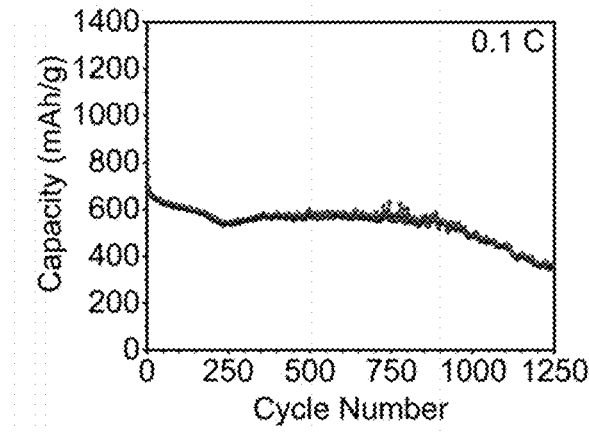
Figure 11D:
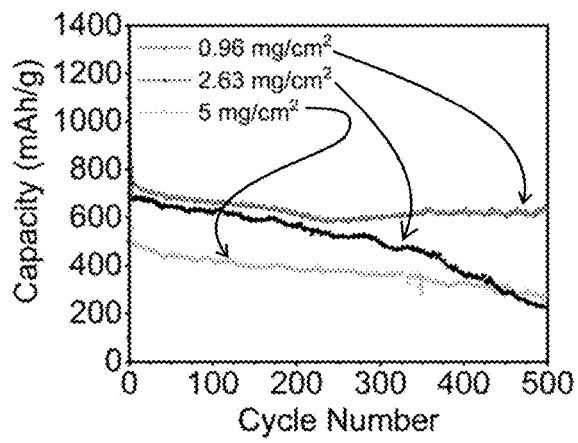

To evaluate the practical application of the carbonate-based Li—S system, the cells were cycled with gamma sulfur deposited-CNFs cathodes at various C rates and loadings. As shown earlier, these batteries demonstrate stable capacity at a 0.5 C rate for over 2000 cycles. To demonstrate battery operation at harsh conditions, the batteries were tested for long term cycling at 0.1 C. The batteries provided stable ~600 mAh/g capacity for over 1000 cycles with a small 0 0015% decay and a coulombic efficiency>=99%. In addition, these batteries show excellent rate performance with capacities of 1170, 1080, 980, 900, 750, 600 and 410 mAh/g at 1 C, 2 C, 5 C, 10 C, 15 C, 30 C and 40 C, respectively. It is interesting to see these cells exhibiting a capacity of 400 mAh/g even at 40 C corresponding to a discharge and charge time of only ~30 seconds. The traditional ether-based batteries perform only up to 2 C at which the performance deteriorates significantly. FIG. 11B shows that the cells exhibit a similar single plateau discharge at all C rates. Such rate capability suggests efficient nanoscale contact between the gamma-monoclinic sulfur and the host CNFs and good interfacial electrode-electrolyte contact owing to the 3D inter-fiber porous architecture. Furthermore, the binder-free freestanding format of the CNF host appears to provide uninterrupted electron pathways despite the presence of insulating sulfur. This is unique compared to traditional slurry-based cathodes where carbon and sulfur powders are mixed together with limited to no control over spatial morphology which thereby deteriorates overall composite conductivity. FIG. 11B shows the cycling data for higher commercially-relevant sulfur loadings. Cells with 5 mg/cm² of sulfur demonstrate stable cycling for 300+ cycles at 0.1 C. This finding demonstrates that unconfined sulfur deposition using gamma monoclinic phase sulfur on external carbon surfaces make it possible to provide commercially-relevant sulfur loadings in carbonate electrolyte.

A handful of reports in the literature have reported single plateau discharge in carbonate electrolyte in cathodes where sulfur was shown to be fully confined in sub-nano pores. Such discharge behavior has been explained via confinement-driven hypotheses, one example being that the sub-nanometer pore sizes limit the sulfur chain length during synthesis resulting in the formation of smaller sulfur allotropes ($S_2$—$S_4$), which are then directly converted to $Li_2S$ during discharge eliminating long-chain polysulfides. Another hypothesis that has been put forth in the literature is that the confinement of $S_8$ molecules in sub-nanometer pores forces de-solvation of the Li-ions and leads to solid-state lithiation/de-lithiation preventing adverse reactions between polysulfides and carbonate species [Fu and Xin]. These works relied on complete nano-confinement of sulfur. In contrast, in the cathodes of the present invention, sulfur is largely present on the external carbon surface. Exposed unconfined sulfur of this type has been previously associated with irreversible reactions with carbonate electrolyte and battery shut down after the first cycle as shown by Kim et al. One striking difference of the present invention is the crystal structure of the sulfur in the cathodes. Most Li—S literature, regardless of the electrolyte, uses α-orthorhombic sulfur, which is the most stable sulfur allotrope at room temperature. It is therefore likely that the single plateau behavior seen reversibly and consistently for 2000 cycles in the present invention is directly linked to the role of gamma-monoclinic sulfur phase.

A possible reason for such a significant effect of sulfur crystal structure could be the difference in phase density. While there are discrepancies in the reports on densities of various sulfur allotropes as synthesizing a metastable allotrope is non-trivial, Meyer et al. did ground breaking work on sulfur allotropes in the early 1960's. He reported the density for gamma-monoclinic-sulfur as being higher than its α-counterpart (2.19 g/cm$^3$ vs 2.069 g/cm$^3$). The close compactness within the gamma-monoclinic crystal structure possibly provides greater stability and easy lithiation into the gamma monoclinic crystal structure in carbonate electrolyte. In the ether electrolyte, it is believed that gamma monoclinic phase sulfur converts to a more favorable phase to yield a two-plateau discharge. Study on stability of this unique sulfur crystal structure in various electrolytes is underway.

Post mortem studies were conducted using XRD and XPS to understand the redox products after charge and discharge cycles and to provide evidence that the stable capacity is indeed largely a result of the desired sulfur to $Li_2S$ reactions (and not any unwanted degradation reactions). This is also particularly important as most papers reporting single plateau discharge profile in Li—S batteries do not provide reactant and/or product characterization for deeper understanding of the charge storage mechanism and to evaluate electrolyte decomposition (if any). Below we discuss both post mortem spectroscopy and microscopy data.

Postmortem SEM and TEM Analysis

Figure 12A:
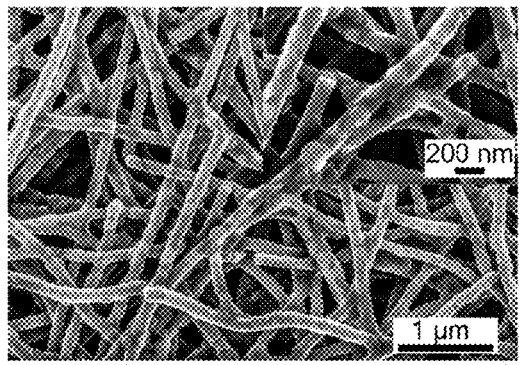
FIGS. 12A-12B show post-mortem SEM and TEM analysis of gamma sulfur deposited CNFs after 20 Charge-Discharge Cycles.
Figure 12B:
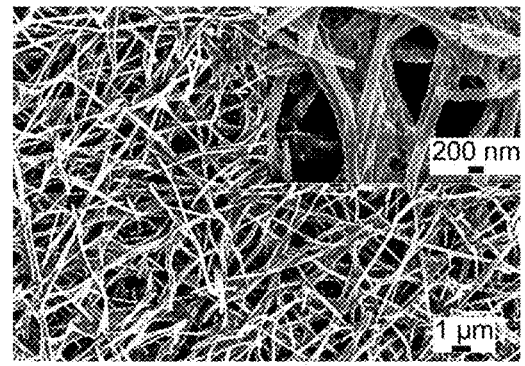
Figure 12C:
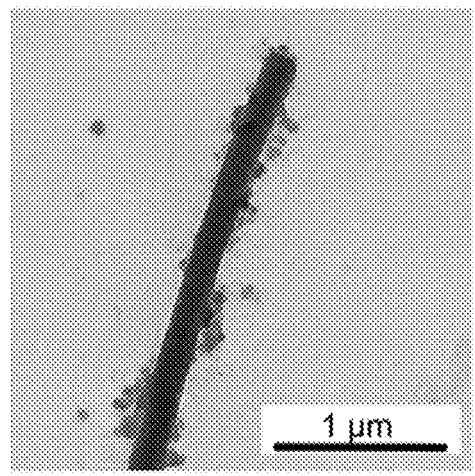
FIG. 12C shows a SEM image taken after lithiation in a completely discharged sample post 1000 cycles, showing the adherence of sulfur to carbon nanofibers.

To understand chemistry and surface morphology after harsh cycling conditions, we conducted post mortem microscopy of cycled cells. The surface morphology gamma sulfur deposited-CNFs after 20 charge and discharge cycles at C/20 is shown in FIGS. 12A-12B. Compared to pristine samples, the charged and discharged samples still retain their freestanding architecture. However, the surface deposited gamma monoclinic phase sulfur redistributes itself on the surface possibly due to volume expansion-contraction during discharge-charge cycles. Nevertheless, gamma monoclinic phase sulfur still remains exposed and unconfined on the surface of CNFs FIG. 12C shows a TEM image taken after lithiation in a completely discharged sample post 1000 cycles showing the adherence of sulfur to carbon nanofibers. Furthermore, the preserved free-standing gamma sulfur deposited-CNFs architecture in this TEM image corroborates with the excellent cycling performance implying that the electrode structure can afford to accommodate the volume expansion of sulfur during cycling and also facilitate better electrode-electrolyte contact throughout the cycle life.

Postmortem XPS and XRD Analysis

Figure 13A:
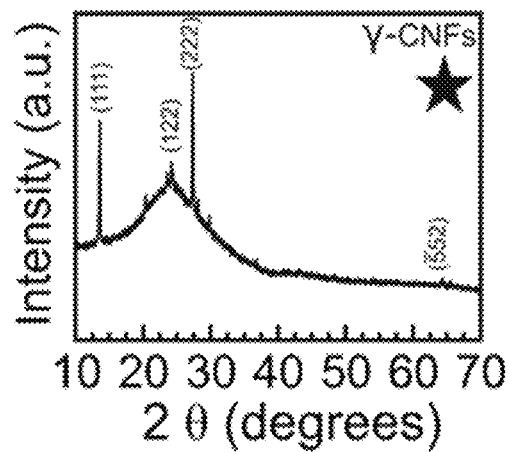
FIGS. 13A-13G show post-mortem XRD and XPS analyses of gamma sulfur deposited CNFs after five charge-discharge cycles, at C/10.
Figure 13B:
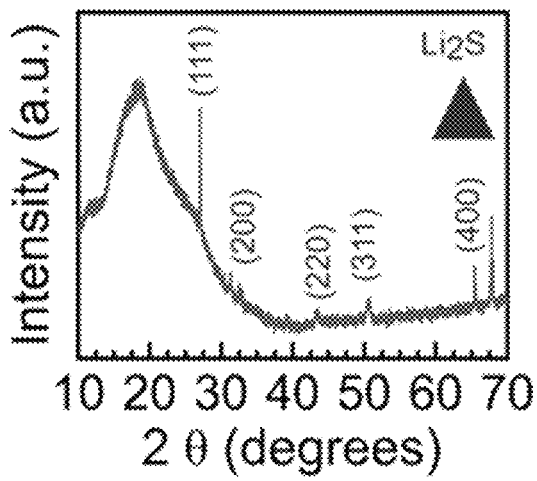
Figure 13C:
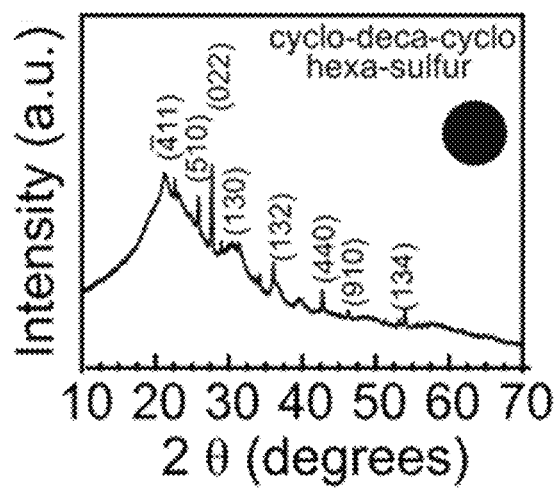
Figure 13D:
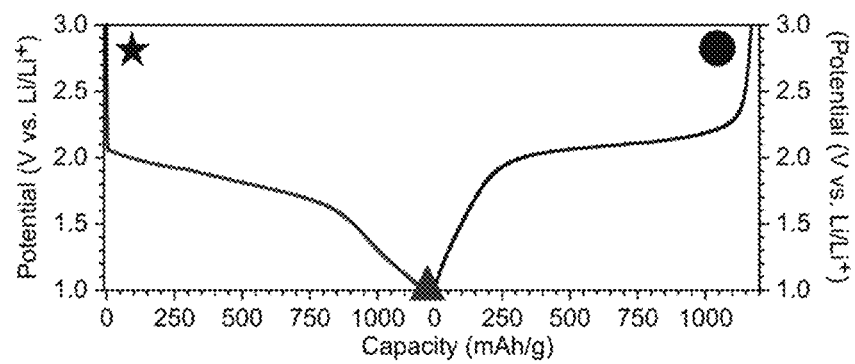
Figure 13E:
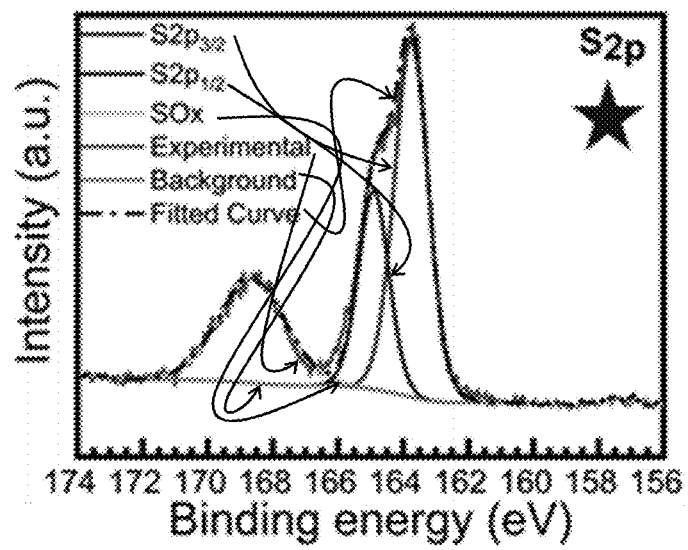
Figure 13F:
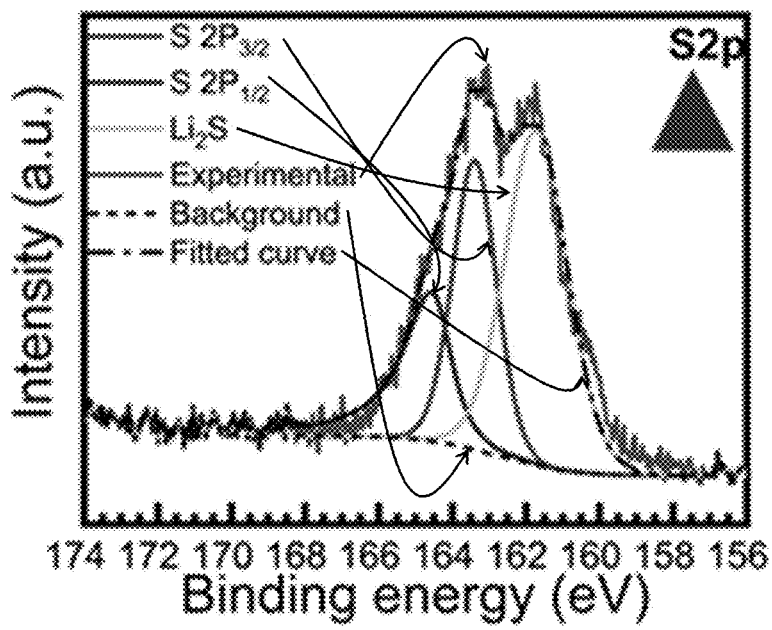
Figure 13G:
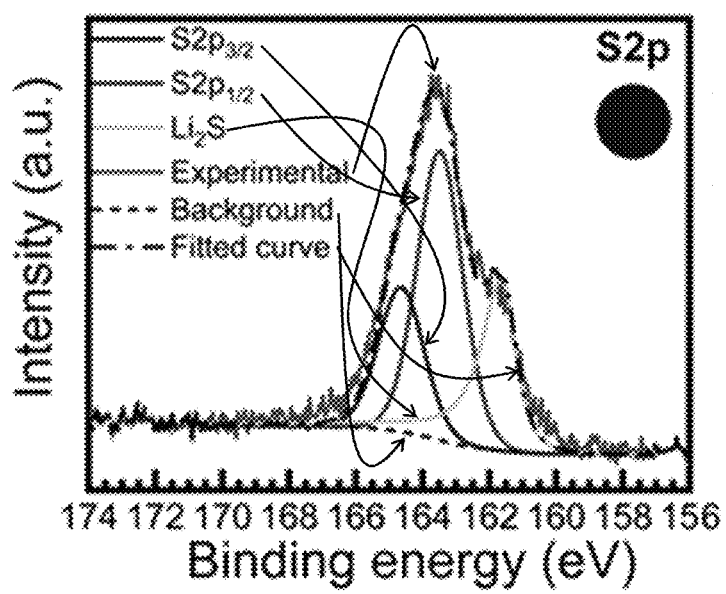
Figure 13H:
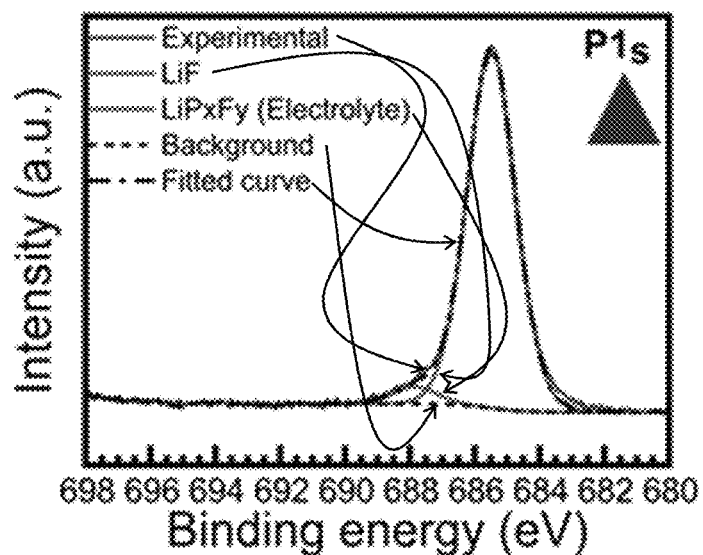
FIGS. 13H and 13I show XPS spectra of discharged and charged samples of fluorine, respectively. The formation of LiF layers on the surface and some salt species indexed were observed at −685.5 eV ad 688 eV, respectively. The formation of LiF was not consistent on the surface as observed in cycled SEM images.
Figure 13I:
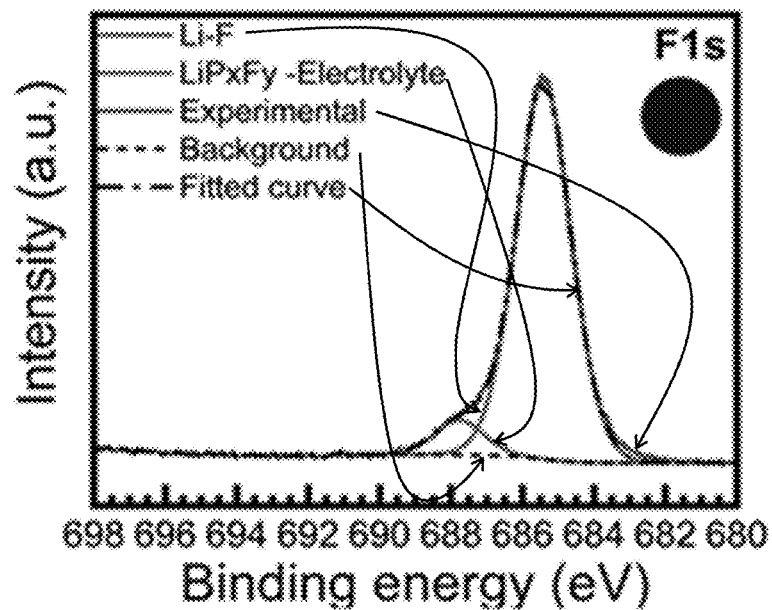

FIGS. 13A-13I provide the post mortem XPS and XRD data both after discharge and after charge. FIG. 13D shows typical charge-discharge voltage profiles obtained for the samples and the specific points where spectroscopy data was collected after discharge and after charge. Prior to XPS analysis, the cycled samples were thoroughly rinsed with the electrolyte solvent and dried out under Ar atmosphere and later under dynamic vacuum for 48 hours. The samples were then loaded in an XPS transfer assembly in the glove box and transferred to an XPS vacuum chamber avoiding any contact with ambient atmosphere. A pass energy of 23.5 eV, with a step size of 0.5 eV was used to gather the high-resolution spectra. CasaXPS Version 2.3.19 PR1.0 software was used for peak fitting. The XPS spectra were calibrated by setting the valence edge to zero, which was calculated by fitting the valence edge with a step-down function and setting the intersection to 0 eV. The conductive elements were fitted using an asymmetric Lorentzian line shape. The non-conductive peaks, on the other hand, were fitted using an asymmetric Gaussian/Lorentzian line shape. The background was determined using the Shirley algorithm, which is a built-in function in the CasaXPS software.

As discussed earlier, in the pristine sample with vapor deposited gamma monoclinic phase sulfur, we see the presence of adventitious carbon, C at 284.6 eV from the CNF surface. The S2P spectra shows the presence of sulfur doublet peaks ($S2p_{3/2}$ and $S2p_{1/2}$) positioned at 163.7 and 164.9 eV with a peak separation of 1.18 eV. In addition, we see a peak at higher binding energy (168.94 eV) associated with the formation of surface oxides (S—O) during high temperature deposition. Similar bonds can be seen in the O1s spectra, wherein the peak at 531.86 eV can be attributed to the surface oxide. Extreme care was taken during transfer of the samples, hence another peak at 532.34 eV was ascribed to a surface oxidized SOx group.

After complete discharge, the $S_{2p}$ spectra shows the appearance of a new strong peak at a lower binding energy of 161.8 eV associated with lithium sulfide ($Li_2S$) deposition. Interestingly, the presence of a new peak at 685.5 eV is attributed to LiF in the F1s spectra. In addition, we see a diminished peak contribution from surface deposited electrolyte salts ($LiF_xN_y$) at 688 eV compared to the charged sample spectra. The signature of LiF species was not seen in the postmortem XRD spectrum (to be discussed below) denoting its extremely low contribution. Postmortem SEM or TEM images of charged and discharged samples shown above did not demonstrate formation of spherical agglomerates on the surface of CNFs often associated with LiF formation, further suggesting low LiF deposition originating from specific sites.

The carbonate electrolyte is expected to be stable and not decompose in the 1-4.2 V vs Li/Li+ range and the formation of LiF can be attributed to decomposition of the salt and not the organic electrolyte as no organic species can be seen in the cycled C1s and O1s spectra. Also, at lower scan rates no current response was recorded corresponding to possible salt decomposition.

After complete charge, S2p spectra shows a diminished $Li_2S$ peak at 161.8 eV and sulfur doublet peaks dominate the overall spectrum indicating reversible conversion of $Li_2S$ back to sulfur in the charge cycle. The presence of some $Li_2S$ even after charge may be associated with incomplete conversion due to the fast charge rate. The F1s spectra continues to show the presence of LiF and LiFxNy peaks from salt decomposition and salt species at 685.5 and 688 eV, respectively, in charged samples, which is expected as LiF is known to be a stable SEI component in Li-ion batteries.

FIGS. 13A-13C show the XRD patterns of the pristine gamma sulfur deposited-CNFs, as well as discharged and charged cathodes. The diffractogram of the pristine cathode as discussed earlier shows peaks of gamma monoclinic phase sulfur. During initial discharge, we observe a plateau at 2.0 V. The plateau continues to progress towards complete sulfur reduction at 1.0 V at a rate of 0.1 C. After complete reduction of cathodes, the diffraction pattern shows the presence of $Li_2S$ peaks (00-023-0369) at 11.61, 13.41, 19.01, 22.31, which correspond to reflections (111), (200), (220) and (311), respectively. It confirms the finding from XPS and TEM that the single plateau observed in the discharge cycle is associated with the reduction of gamma monoclinic phase sulfur to lithium sulfide ($Li_2S$). After charge, interestingly, a completely different sulfur XRD pattern is observed. Such pattern has not been reported yet in the Li—S literature. These peaks are attributed to cyclo-deca-cyclo-hexa sulfur, also belonging to a monoclinic crystal structure family. No overlapping gamma monoclinic sulfur peaks were observed. This post mortem study demonstrates complete conversion of β-monoclinic sulfur to $Li_2S$ and back to a new sulfur monoclinic crystal phase. This is the first ever study to report stability of such sulfur crystal structures in Li—S batteries and their operation in carbonate electrolyte. It has been previously reported in ether-based Li—S batteries that α-orthorhombic sulfur allotrope (the most stable sulfur allotrope at room temperature) indeed converts to the β-monoclinic phase and that phase dominates after the first charge cycle. Using this analogy, we hypothesize that the monoclinic phase is thermodynamically more stable in the Li—S electrolyte medium and is therefore retained in our system even after the charging cycle. Nevertheless, we observe a unique monoclinic phase in these charged samples, which is different from the β-monoclinic phase seen in ether electrolyte and this possibly plays a role in retaining single plateau behavior in charge-discharge profiles for over 2000 cycles. All experiments with Li—S cells were carried out at about 18-25° C. unless otherwise specified.

Figure 14A:
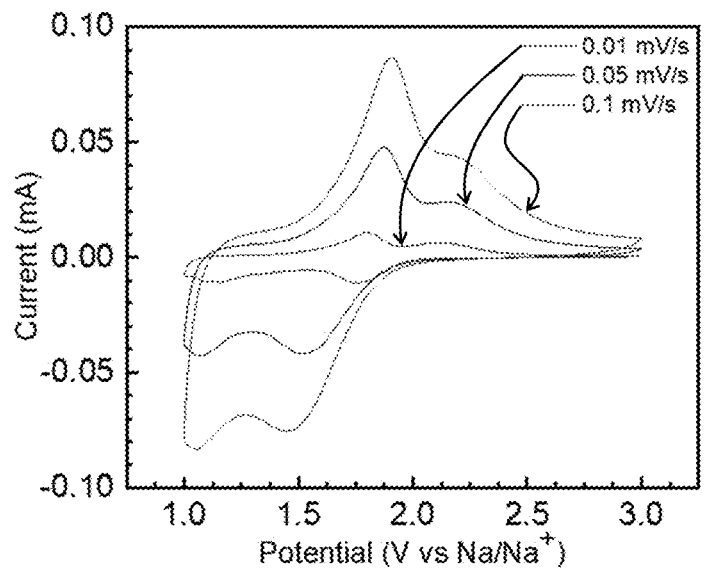
FIG. 14A shows cyclic voltammetry (CV) curves of a gamma sulfur deposited CNFs cathode at various can rates.
Figure 14B:
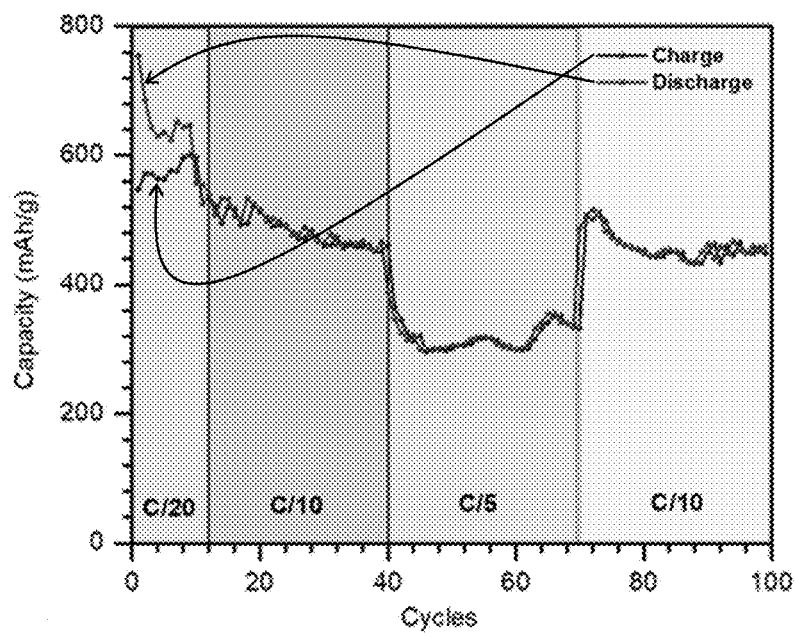
FIG. 14B shows the rate performance of a gamma sulfur deposited CNFs cathode at various current densities.
Figure 14C:
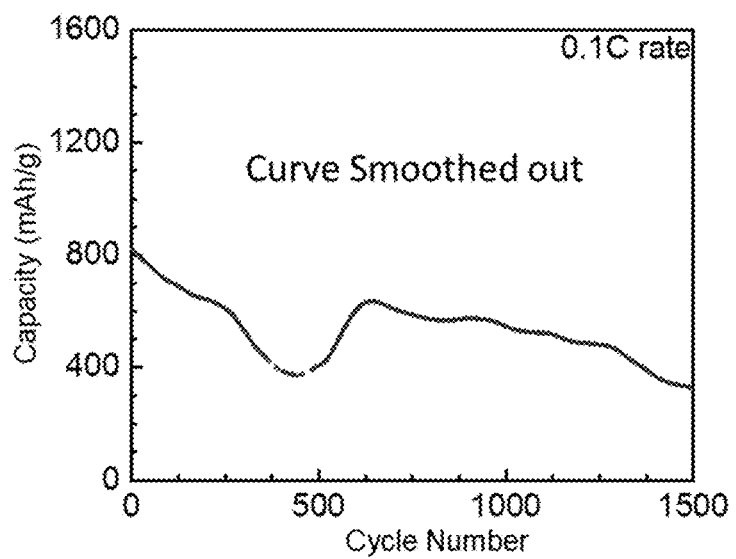
FIG. 14C shows the cycling stability of cathodes at a 0.1 C rate.
Figure 14D:
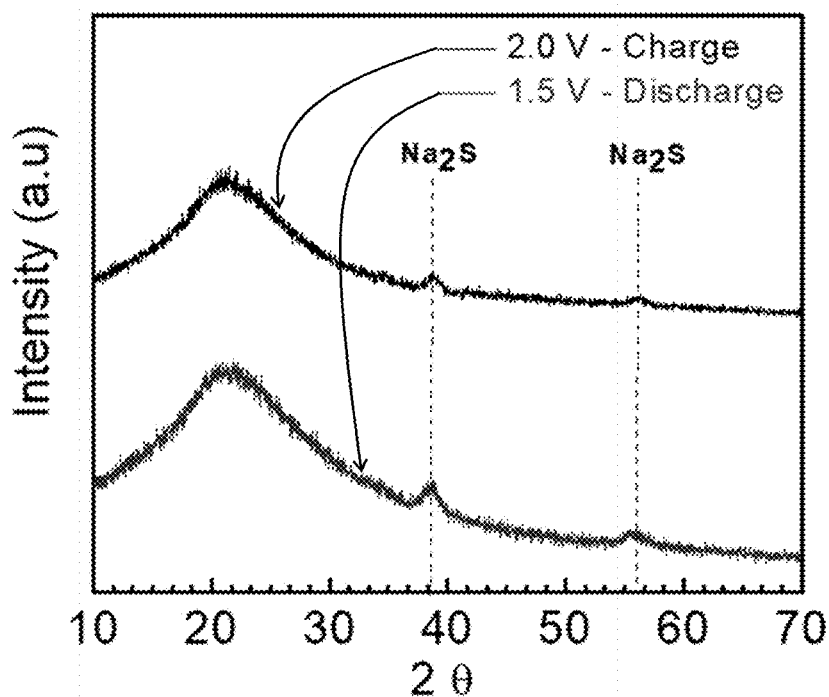
FIG. 14D shows the post mortem XRD patterns of a gamma sulfur deposited CNFs cathode.

Sodium Sulfur Cells FIG. 14A displays a cyclic voltammetry curve of gamma sulfur deposited-CNFs cathode with a sodium anode in 1M $NaClO_4$ in EC:DEC (1:1 V/V) with 5% FEC at various scan rates. In the reduction curve, two peaks can be seen which are attributed to the conversion of sulfur to short chain sodium sulfides $Na_2S_2$ and $Na_2S$, respectively. Further, a similar trend in the oxidation curve is seen where $Na_2S$ converts to $Na_2S_2$, and then finally to sulfur. FIG. 14B displays the rate performance of gamma sulfur deposited-CNFs in carbonate-based electrolytes. It delivers a high initial capacity of 780 mAh/g at a 0.05 C rate. Further improvement in the C rate to 0.1 C and 0.2 C, causes a loss of capacity attributed to higher current densities and lower time for conversion and reaction, which capacities stabilized at 550 mAh/g and 325 mAh/g, respectively. These experiments were carried out at about 18-25° C.

Potassium Sulfur Cells

Figure 15A:
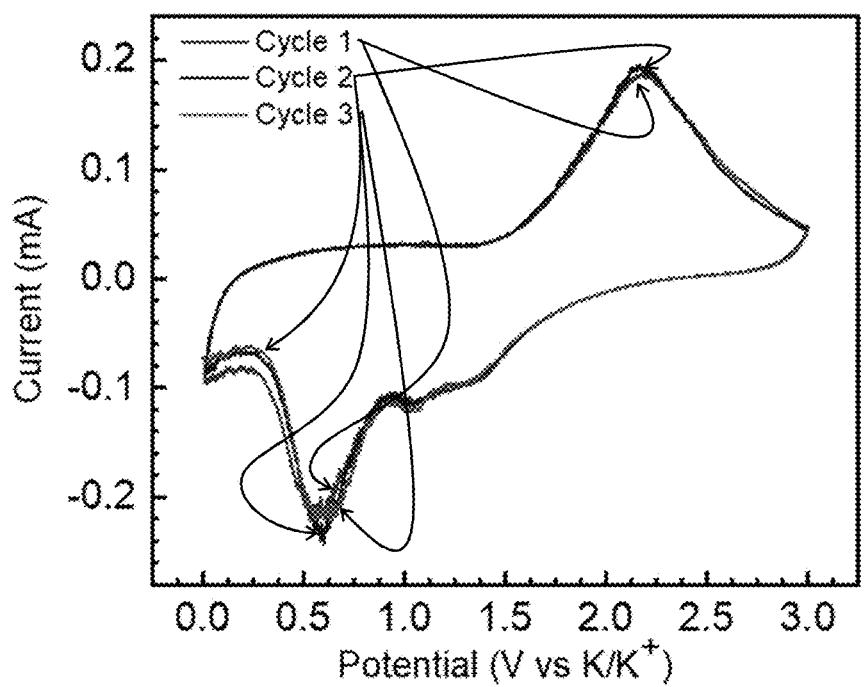
FIG. 15A shows CV curves of a gamma sulfur deposited CNFs cathode at 0.1 mVs$^{-1}$ scan rates.
Figure 15B:
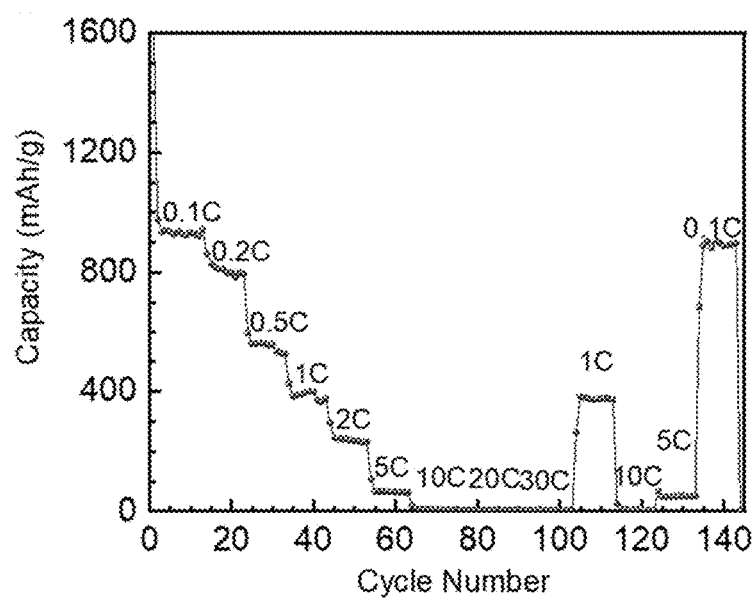
FIG. 15B shows the rate performance of a gamma sulfur deposited CNFs cathode at various current densities.
Figure 15C:
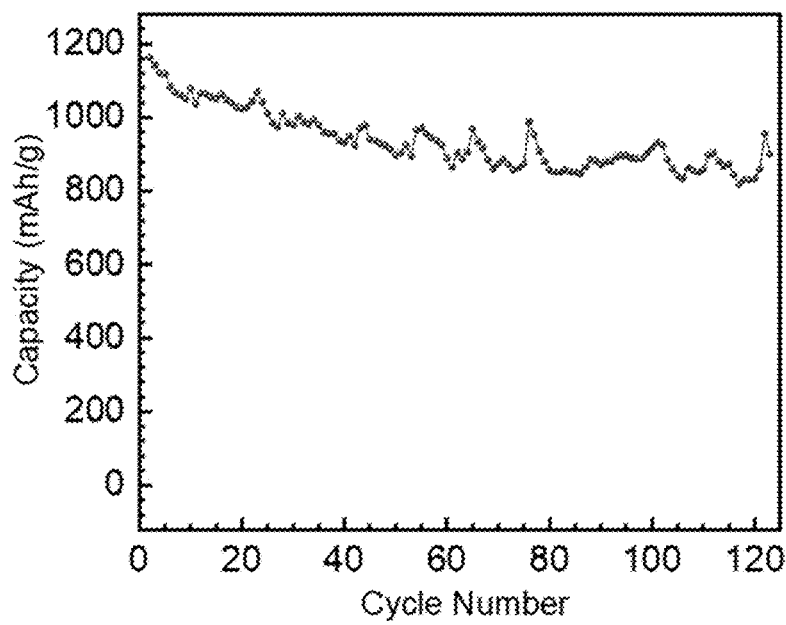
FIG. 15C shows the cycling stability of a gamma sulfur deposited CNFs cathode at a 0.5 C rate.
Figure 16:
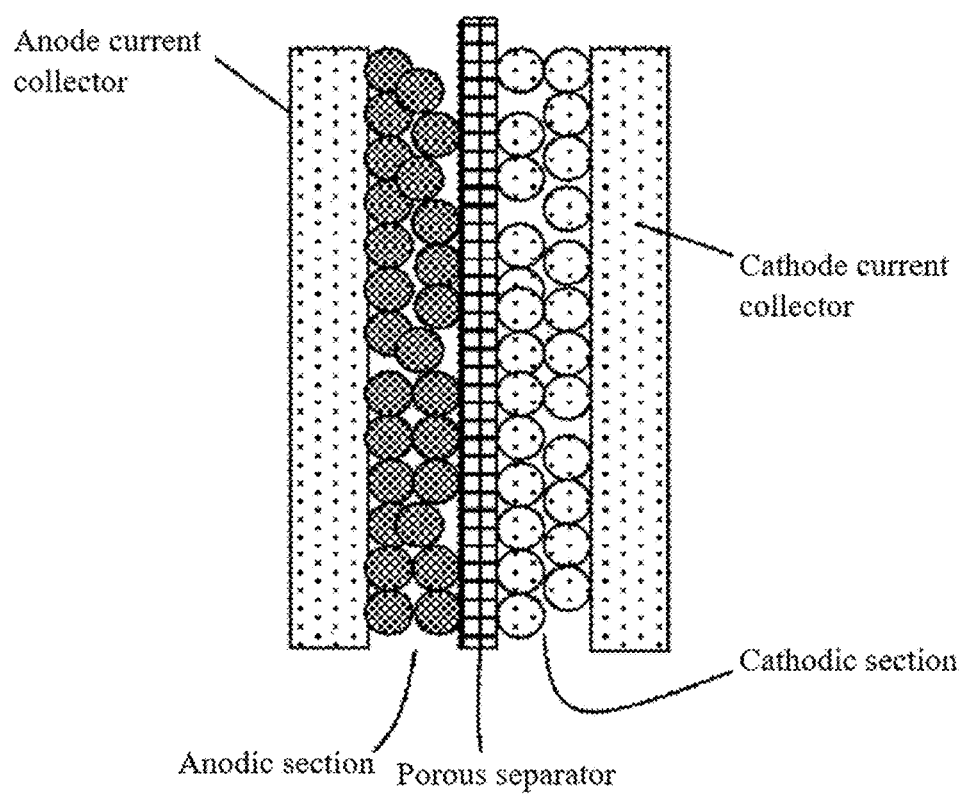
FIG. 16 is a schematic of a sulfur battery of the present invention including anode and cathode current collectors and a porous separator.

FIG. 15A displays a cyclic voltammetry curve of a gamma sulfur deposited-CNFs cathode with a potassium anode in 1 M $KPF_6$ in EC:DEC at various cycles at 0.1 mV/s. In the reduction peak, 3 distinct peaks are attributed to the conversion of sulfur to $K_2S_3$ to $K_2S_2$ and finally to $K_2S$. However, during the charge step, a single oxidation peak is observed, which is attributed to direct conversion to sulfur without intermediate conversion. A gamma sulfur deposited-CNFs cathode performs substantially better than any cathodes reported in the literature up to 5 C. The cathode retains all of its capacity when cycled back at 0.1 C, displaying superior cathode architecture and complete utilization of the active material. Cycling stability was studied at 0.5 C rate, and the cathode displayed a capacity of 870 mAh/g after 120 cycles showing its potential to be used as a cathode material in a potassium-sulfur system. These experiments were carried out at about 18-25° C.

Other embodiments of the present disclosure will be apparent to those skilled in the art from consideration of the specification and practice of the embodiments disclosed herein. As used throughout the specification and claims, "a" and/or "an" may refer to one or more than one. Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. It is intended that the specification and examples be considered as exemplary only, with a true scope and spirit of the disclosure being indicated by the following claims.

The foregoing embodiments are susceptible to considerable variation in practice. Accordingly, the embodiments are not intended to be limited to the specific exemplifications set forth hereinabove. Rather, the foregoing embodiments are within the spirit and scope of the appended claims, including the equivalents thereof available as a matter of law. Other suitable modifications and adaptations of the variety of conditions and parameters normally encountered in the field, and which are obvious to those skilled in the art, are within the scope of the disclosure.

All patents and publications cited herein are fully incorporated by reference herein in their entirety or at least for the portion of their description for which they are specifically cited or relied upon in the present description.

The patentees do not intend to dedicate any disclosed embodiments to the public, and to the extent any disclosed modifications or alterations may not literally fall within the scope of the claims, they are considered to be part hereof under the doctrine of equivalents.

It is to be understood that each component, compound, substituent or parameter disclosed herein is to be interpreted as being disclosed for use alone or in combination with one or more of each and every other component, compound, substituent or parameter disclosed herein.

It is also to be understood that each amount/value or range of amounts/values for each component, compound, substituent or parameter disclosed herein is to be interpreted as also being disclosed in combination with each amount/value or range of amounts/values disclosed for any other component(s), compounds(s), substituent(s) or parameter(s) disclosed herein and that any combination of amounts/values or ranges of amounts/values for two or more component(s), compounds(s), substituent(s) or parameters disclosed herein are thus also disclosed in combination with each other for the purposes of this description.

It is further understood that each range disclosed herein is to be interpreted as a disclosure of each specific value within the disclosed range that has the same number of significant digits. Thus, a range of from 1-4 is to be interpreted as an express disclosure of the values 1, 2, 3 and 4.

It is further understood that each lower limit of each range disclosed herein is to be interpreted as disclosed in combination with each upper limit of each range and each specific value within each range disclosed herein for the same component, compounds, substituent or parameter. Thus, this disclosure to be interpreted as a disclosure of all ranges derived by combining each lower limit of each range with each upper limit of each range or with each specific value within each range, or by combining each upper limit of each range with each specific value within each range.

Furthermore, specific amounts/values of a component, compound, substituent or parameter disclosed in the description or an example is to be interpreted as a disclosure of either a lower or an upper limit of a range and thus can be combined with any other lower or upper limit of a range or specific amount/value for the same component, compound, substituent or parameter disclosed elsewhere in the application to form a range for that component, compound, substituent or parameter.

REFERENCES

The following references may be useful in understanding some of the principles discussed herein:
1 Manthiram, A., Fu, Y., Chung, S. H., Zu, C. & Su, Y. S. Rechargeable lithium-sulfur batteries. *Chem Rev* 114, 11751-11787, doi:10.1021/cr500062v (2014).
2 Armand, M. & Tarascon, J. M. Building better batteries. *Nature* 451, 652-657, doi:10.1038/451652a (2008).
3 Evers, S. & Nazar, L. F. New approaches for high energy density lithium-sulfur battery cathodes. *Acc Chem Res* 46, 1135-1143, doi:10.1021/ar3001348 (2013).
4 Bruce, P. G., Freunberger, S. A., Hardwick, L. J. & Tarascon, J. M. Li—O2 and Li—S batteries with high energy storage. *Nat Mater* 11, 19-29, doi:10.1038/nmat3191 (2011).
5 Fang, R. et al. More Reliable Lithium-Sulfur Batteries: Status, Solutions and Prospects. *Adv Mater* 29, doi:10.1002/adma.201606823 (2017).
6 Peng, H.-J., Huang, J.-Q., Cheng, X.-B. & Zhang, Q. Review on High-Loading and High-Energy Lithium-Sulfur Batteries. *Advanced Energy Materials* 7, doi:10.1002/aenm.201700260 (2017).
7 Lv, D. et al. High Energy Density Lithium-Sulfur Batteries: Challenges of Thick Sulfur Cathodes. *Advanced Energy Materials* 5, doi:10.1002/aenm.201402290 (2015).
8 Liu, M. et al. A Review: Electrospun Nanofiber Materials for Lithium-Sulfur Batteries. *Advanced Functional Materials, doi:*10.1002/adfm.201905467 (2019).
9 Yuan, H. et al. A Review of Functional Binders in Lithium-Sulfur Batteries. *Advanced Energy Materials* 8, doi:10.1002/aenm.201802107 (2018).
10 Aurbach, D. et al. On the Surface Chemical Aspects of Very High Energy Density, Rechargeable Li—Sulfur Batteries. *Journal of The Electrochemical Society* 156, doi:10.1149/1.3148721 (2009).
11 Li, X. et al. Safe and Durable High-Temperature Lithium-Sulfur Batteries via Molecular Layer Deposited Coating. *Nano Lett* 16, 3545-3549, doi:10.1021/acs.nanolett.6b00577 (2016).
12 Xu, Z. et al. Enhanced Performance of a Lithium-Sulfur Battery Using a Carbonate-Based Electrolyte. *Angew Chem Int Ed Engl* 55, 10372-10375, doi:10.1002/anie.201605931 (2016).
13 Cleaver, T., Kovacik, P., Marinescu, M., Zhang, T. & Offer, G. Perspective—Commercializing Lithium Sulfur Batteries: Are We Doing the Right Research? *Journal of The Electrochemical Society* 165, A6029-A6033, doi:10.1149/2.0071801je5 (2017).
14 Choi, J. W. & Aurbach, D. Promise and reality of post-lithium-ion batteries with high energy densities. *Nature Reviews Materials* 1, doi:10.1038/natrevmats.2016.13 (2016).
15 Marom, R., Amalraj, S. F., Leifer, N., Jacob, D. & Aurbach, D. A review of advanced and practical lithium battery materials. *Journal of Materials Chemistry* 21, doi:10.1039/c0jm04225k (2011).
16 Zhang, S. S. A review on electrolyte additives for lithium-ion batteries. *Journal of Power Sources* 162, 1379-1394, doi:10.1016/j.jpowsour.2006.07.074 (2006).
17 Yim, T. et al. Effect of chemical reactivity of polysulfide toward carbonate-based electrolyte on the electrochemical performance of Li—S batteries. *Electrochimica Acta* 107, 454-460, doi:10.1016/j.electacta.2013.06.039 (2013).
18 Helen, M. et al. Single step transformation of sulphur to Li2S2/Li2S in Li—S batteries. *Sci Rep* 5, 12146, doi:10.1038/srep12146 (2015).
19 Xin, S. et al. Smaller sulfur molecules promise better lithium-sulfur batteries. *J Am Chem Soc* 134, 18510-18513, doi:10.1021/ja308170k (2012).
20 Fu, C., Wong, B. M., Bozhilov, K. N. & Guo, J. Solid state lithiation-delithiation of sulphur in sub-nano confinement: a new concept for designing lithium-sulphur batteries. *Chem Sci* 7, 1224-1232, doi:10.1039/c5sc03419a (2016).
21 Chung, S. H. & Manthiram, A. Carbonized eggshell membrane as a natural polysulfide reservoir for highly reversible Li—S batteries. *Adv Mater* 26, 1360-1365, doi:10.1002/adma.201304365 (2014).
22 Meyer, B. Solid Allotropes of Sulfur. *Chemical Reviews* 64, 429-451, doi:10.1021/cr60230a004 (1964).
23 Meyer, B. Elemental sulfur. *Chemical Reviews* 76, 367-388, doi:10.1021/cr60301a003 (1976).
24 Takeda, N., Tokitoh, N. & Okazaki, R. in *Topic in Current Chemistry Topics in Current Chemistry* Ch. Chapter 0005, 153-202 (2003).

25 Moon, S. et al. Encapsulated monoclinic sulfur for stable cycling of li-s rechargeable batteries. *Adv Mater* 25, 6547-6553, doi:10.1002/adma.201303166 (2013).
26 Gallacher, A. C. & Pinkerton, A. A. A redetermination of monclinic γ-sulfur. *Acta Crystallographica Section C Crystal Structure Communications* 49, 125-126, doi: 10.1107/s0108270192009661 (1993).
27 Templeton, L. K., Templeton, D. H. & Zalkin, A. Crystal structure of monoclinic sulfur. *Inorganic Chemistry* 15, 1999-2001, doi:10.1021/ic50162a059 (1976).
28 Jung, S. C. & Han, Y.-K. Monoclinic sulfur cathode utilizing carbon for high-performance lithium-sulfur batteries. *Journal of Power Sources* 325, 495-500, doi: 10.1016/j.jpowsour.2016.06.057 (2016).
29 Takahagi, T. & Ishitani, A. XPS study on the surface structure of carbon fibers using chemical modification and C1s line shape analysis. *Carbon* 26, 389-395, doi: 10.1016/0008-6223(88)90231-x (1988).
30 Liang, X. et al. A highly efficient polysulfide mediator for lithium-sulfur batteries. *Nat Commun* 6, 5682, doi: 10.1038/ncomms6682 (2015).

What is claimed is:

1. A method of depositing monoclinic sulfur on a substrate of a porous material, comprising steps of:
depositing monoclinic phase sulfur that is stable at a temperature below 80° C. via vapor deposition onto the substrate of the porous material in a sealed vapor deposition apparatus at a temperature sufficient to vaporize sulfur and for a time sufficient to provide the monoclinic phase sulfur, and
cooling the monoclinic phase sulfur deposited on the substrate of the porous material to a temperature of 0-50° C.,
wherein the substrate is positioned in the vapor deposition apparatus with a gab between a surface of a liquid sulfur reservoir and the substrate such that the substrate does not come into contact with liquid sulfur during the vapor deposition step.

2. The method of claim 1, wherein the method provides a substrate with monoclinic sulfur deposited therein that is suitable for use as a cathode in an electrode of a cell or battery and a loading of the monoclinic phase sulfur on the substrate is at least 0.05 mg/cm$^2$.

3. The method of claim 1, wherein the depositing step is carried out in the sealed vapor deposition apparatus at a temperature of from 140° C. to 350° C.

4. The method of claim 1, wherein the depositing step is carried out for a period of at least about 1 minute.

5. The method of claim 1, wherein the cooling step is carried out by exposing the vapor deposition apparatus or the cathode to a temperature of less than 50° C.

6. The method of claim 5, wherein the vapor deposition apparatus is cooled immediately upon completion of the depositing step.

7. The method of claim 1, wherein the substrate of the porous material has a pore volume of 10-95% after deposition of the monoclinic phase sulfur on the substrate.

8. The method of claim 1, wherein the substrate is conductive.

9. The method of claim 1, wherein the substrate comprises carbon nanofibers.

10. The method of claim 9, wherein the carbon nanofibers onto which the monoclinic phase sulfur is deposited are free-standing carbon nanofibers.

11. The method of claim 1, wherein the monoclinic phase sulfur comprises a form of sulfur selected from the group consisting of monoclinic gamma phase sulfur; monoclinic sulfur that best matches monoclinic gamma phase sulfur using PDXL Version 2.8.4.0 Integrated Powder Diffraction Software; monoclinic gamma phase sulfur oriented in the k direction; and monoclinic sulfur that best matches monoclinic gamma phase sulfur oriented in the k direction using PDXL Version 2.8.4.0 Integrated Powder Diffraction Software.

12. The method of claim 1, wherein the method provides a substrate with monoclinic sulfur deposited therein that is suitable for use as a cathode in an electrode of a cell or battery and a loading of the monoclinic phase sulfur on the substrate is at least 0.5 mg/cm$^2$.

13. The method of claim 1, wherein the depositing step is carried out in the sealed vapor deposition apparatus at a temperature of from 150° C. to 210° C.

14. The method of claim 1, wherein the depositing step is carried out for a period of 10 to 30 hours.

15. The method of claim 1, wherein the cooling step is carried out by exposing the vapor deposition apparatus or the cathode to a temperature of from about −20° C. to about 25° C.

16. The method of claim 1, wherein the monoclinic phase sulfur comprises a form of sulfur selected from the group consisting of monoclinic gamma phase sulfur; monoclinic sulfur that best matches PDF Card No.: 00-013-0141 Quality:B for Rosickyite, monoclinic gamma phase sulfur, using PDXL Version 2 Integrated Powder Diffraction Software.

17. The method of claim 16, wherein the substrate is non-conductive and the method provides a substrate with monoclinic sulfur deposited therein that is suitable for use as a cathode in an electrode of a cell or battery and a loading of the monoclinic phase sulfur on the substrate is at least 0.5 mg/cm$^2$ and the depositing step is carried out in the sealed vapor deposition apparatus at a temperature of from 150° C. to 210° C. for a period of 10 to 30 hours.

18. A method of depositing monoclinic sulfur on a substrate of a porous material, comprising steps of:
depositing monoclinic phase sulfur that is stable at a temperature below 80° C. via vapor deposition onto the substrate of the porous material in a sealed vapor deposition apparatus at a temperature sufficient to vaporize sulfur and for a time sufficient to provide the monoclinic phase sulfur, and
cooling the monoclinic phase sulfur deposited on the substrate of the porous material to a temperature of 0-50° C.,
wherein the substrate is non-conductive.

19. A method of depositing monoclinic sulfur on a substrate of a porous material, comprising steps of:
depositing monoclinic phase sulfur that is stable at a temperature below 80° C. via vapor deposition onto the substrate of the porous material in a sealed vapor deposition apparatus at a temperature sufficient to vaporize sulfur and for a time sufficient to provide the monoclinic phase sulfur, and
cooling the monoclinic phase sulfur deposited on the substrate of the porous material to a temperature of 0-50° C.,
wherein the method provides a substrate with monoclinic sulfur deposited therein that is suitable for use as a cathode in an electrode of a cell or battery and a loading of the monoclinic phase sulfur on the substrate is at least 0.5 mg/cm$^2$ and the depositing step is carried out in the sealed vapor deposition apparatus at a temperature of from 150° C. to 210° C. for a period of 10 to 30 hours.

20. The method of claim 19, wherein the cooling step is carried out by exposing the vapor deposition apparatus or the cathode to a temperature of from about −20° C. to about 25° C. immediately upon completion of the depositing step.

\* \* \* \* \*